(12) United States Patent
Hazelton

(10) Patent No.: US 6,405,659 B1
(45) Date of Patent: Jun. 18, 2002

(54) MONOLITHIC STAGE

(75) Inventor: Andrew J. Hazelton, San Carlos, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/561,589

(22) Filed: May 1, 2000

(51) Int. Cl.[7] ............................................. A47B 85/00
(52) U.S. Cl. ...................................................... 108/20
(58) Field of Search ................................. 318/653, 687, 318/135; 108/20, 21, 22

(56) References Cited

U.S. PATENT DOCUMENTS

| | | | |
|---|---|---|---|
| 3,935,486 A | 1/1976 | Nagashima | |
| 4,506,205 A | 3/1985 | Trost et al. | |
| 4,507,597 A | 3/1985 | Trost | |
| 4,948,330 A | 8/1990 | Nomura et al. | |
| 4,952,858 A | 8/1990 | Galburt | |
| 5,153,494 A | 10/1992 | Hollis, Jr. | |
| 5,157,296 A | 10/1992 | Trumper | |
| 5,196,745 A | 3/1993 | Trumper | |
| 5,294,854 A | 3/1994 | Trumper | |
| 5,327,060 A | 7/1994 | Van Engelen et al. | |
| 5,524,502 A | 6/1996 | Osanai | |
| 5,528,118 A | 6/1996 | Lee | |
| 5,685,232 A | * 11/1997 | Inoue | 108/20 |
| 5,699,621 A | 12/1997 | Trumper et al. | |
| 5,794,541 A | * 8/1998 | Hirose | 108/20 |
| 5,841,250 A | 11/1998 | Korenage et al. | |
| 5,874,820 A | 2/1999 | Lee | |
| 5,883,702 A | 3/1999 | Tokunaga | |
| 6,246,204 B1 | 6/2001 | Ebihara et al. | |

FOREIGN PATENT DOCUMENTS

| | | |
|---|---|---|
| JP | 10-12539 | 1/1998 |
| JP | 11-18406 | 1/1999 |

* cited by examiner

*Primary Examiner*—Jose V. Chen
(74) *Attorney, Agent, or Firm*—Jim Rose; Steven G. Roeder

(57) ABSTRACT

A stage assembly (10) for moving and positioning one or more objects (24) for an exposure apparatus (28) is provided herein. The stage assembly (10) includes a mounting frame (14) and a stage frame (16). The stage frame (16) includes a holder (50) that retains the object (24). The stage assembly (10) also includes X movers (58A) (58B), Y movers (60A) (60B) and Z movers (62A) (62B) that precisely move the stage frame (16) relative to the mounting frame (16). Uniquely, the stage frame (16) is monolithic. With this design, the resulting stage frame (16) is rigid and has a relatively high servo bandwidth. Further, the movers (58A) (58B) (60A) (60B) (62A) (62B) are positioned to act through a center of gravity (51) of the stage frame (16).

51 Claims, 14 Drawing Sheets

MONOLITHIC STAGE

FIELD OF THE INVENTION

The present invention is directed to a stage for moving an object. More specifically, the present invention is directed to a monolithic stage for an exposure apparatus.

BACKGROUND

Exposure apparatuses are commonly used to transfer images from a reticle onto a semiconductor wafer during semiconductor processing. A typical exposure apparatus includes an illumination source, a reticle stage retaining a reticle, a lens assembly and a wafer stage retaining a semiconductor wafer. The reticle stage and the wafer stage are supported above a ground with an apparatus frame. Typically, one or more motors precisely position the wafer stage and one or more motors precisely position the reticle stage. The size of the images transferred onto the wafer from the reticle is extremely small. Accordingly, the precise relative positioning of the wafer and the reticle is critical to the manufacturing of high density, semiconductor wafers.

A typical reticle stage includes a coarse stage and a fine stage. The coarse stage is used for relatively large movements of the reticle and the fine stage is used for relatively small, precise movements of the reticle. Existing reticle stages typically utilize a set of fine motors to move the fine stage and a set of coarse motors to move the coarse stage.

Unfortunately, existing reticle stages that utilize both a coarse stage and a fine stage have a relatively large total mass and are not very stiff. Further, the combination coarse stage and fine stage have a relatively low resonance frequency and a low servo bandwidth. As a result of the low resonant frequency and low servo bandwidth, external forces and/or small reaction forces can easily vibrate and distort the reticle stage. This will influence the position of the reticle stage and the performance of the exposure apparatus.

Additionally, the multiple sets of motors required for the coarse stage and the fine stage complicate the layout of the reticle stage and the system required to control the movement of the coarse stage and the fine stage. Moreover, these motors occupy valuable space near the stage, consume large amounts of electric current and generate a significant amount of heat. The heat is subsequently transferred to the surrounding environment, including the air surrounding the motors and the other components positioned near the motors. The heat changes the index of refraction of the surrounding air. This reduces the accuracy of any metrology system used to monitor the positions of the stages and degrades machine positioning accuracy.

In light of the above, it is an object of the present invention to provide a stage assembly having a stage with a relatively low mass, a relatively high resonance frequency and a relatively high servo bandwidth. Another object is to provide a stage assembly that is relatively simple to manufacture and control. Still another object is to provide a low mass stage that can simultaneously carry two reticles. Yet another object is to provide a stage assembly having a relatively stiff and compact stage. Another object is to provide an exposure apparatus capable of manufacturing high density, semiconductor wafers. Yet another object is to provide a stage assembly having a guideless stage.

SUMMARY

The present invention is directed to a stage assembly for moving an object that satisfies these needs. The stage assembly includes a mounting frame and a stage frame. The stage frame includes a holder that retains the object. The stage frame is moveable along a X axis, along a Y axis that is substantially orthogonal to the X axis, and around a Z axis that is substantially orthogonal to the X axis and the Y axis. As provided herein, the stage assembly can be used to precisely position one or more objects during a manufacturing and/or an inspection process.

Uniquely, the stage frame is monolithic. The term monolithic as used herein shall mean and include systems with substantially a single moving part. With this design, the stage frame is relatively stiff and has a relatively high servo bandwidth. Because of the high stiffness and high servo bandwidth, external forces and small reaction forces are less likely to influence the position of the stage frame. This allows for more accurate positioning of the object by the stage and the production of higher quality wafers. Further, with this design, the stage frame is relatively easily to control.

As provided herein, the stage assembly includes a X mover that moves the stage frame along the X axis, and a Y mover that moves the stage frame along the Y axis. The X mover and/or the Y mover can also be used to move the stage frame about the Z axis. Additionally, the stage assembly can include a Z mover that moves the stage frame along the Z axis, about the X axis and about the Y axis. The X mover includes an X stage component, the Y mover includes a Y stage component, and the Z mover including a Z stage component.

The stage frame includes a first side section and a spaced apart, substantially parallel, second side section. The stage components of the X mover, the Y mover and the Z mover are secured to the side sections. As provided herein, the Y stage component and the Z stage component can be secured to the stage frame substantially directly above the X stage component. Additionally, the Y stage component and the Z stage component can be secured to the stage frame substantially directly below the X stage component. With this design, the forces from the movers can be directed through a center of gravity of the stage frame.

The stage frame provided herein is guideless with at least three degrees of freedom and more preferably six degrees of freedom. More specifically, the stage frame is not constrained along the Y axis, the X axis and about the Z axis and more preferably is also not constrained along the Z axis, about the Y axis and about the X axis. With this design, the movers can precisely control the position of the stage frame along the X axis, along the Y axis, along the Z axis, about the X axis, about the Y axis and about the Z axis. This allows for more accurate positioning of the stage frame and better performance of the stage assembly.

The present invention is also directed to a method for moving an object, a method for manufacturing a stage assembly, a method for manufacturing an exposure apparatus and a method for manufacturing a wafer and a device.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
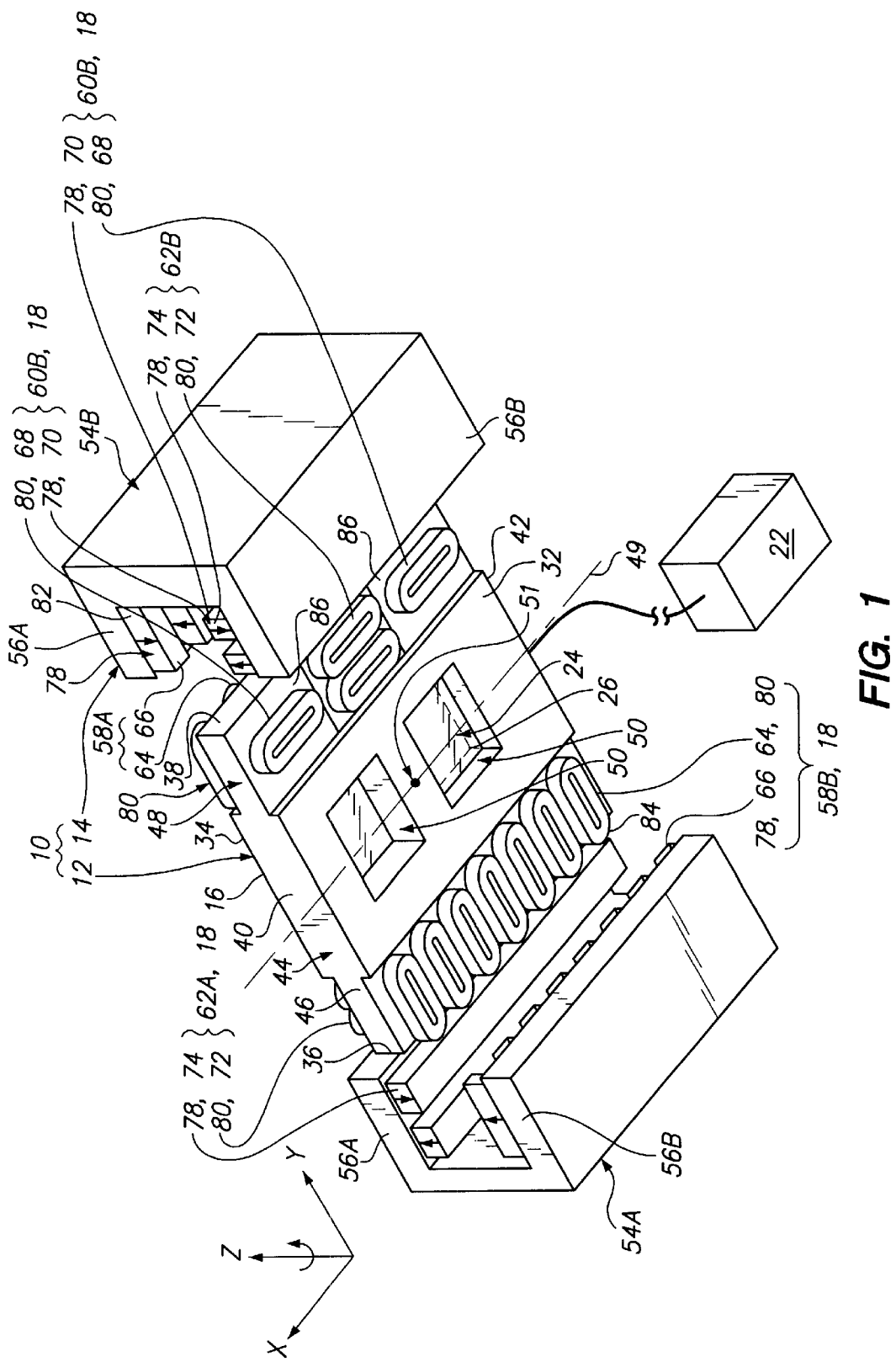
FIG. 1 is an exploded, bottom perspective view of a stage assembly having features of the present invention.
Figure 2:
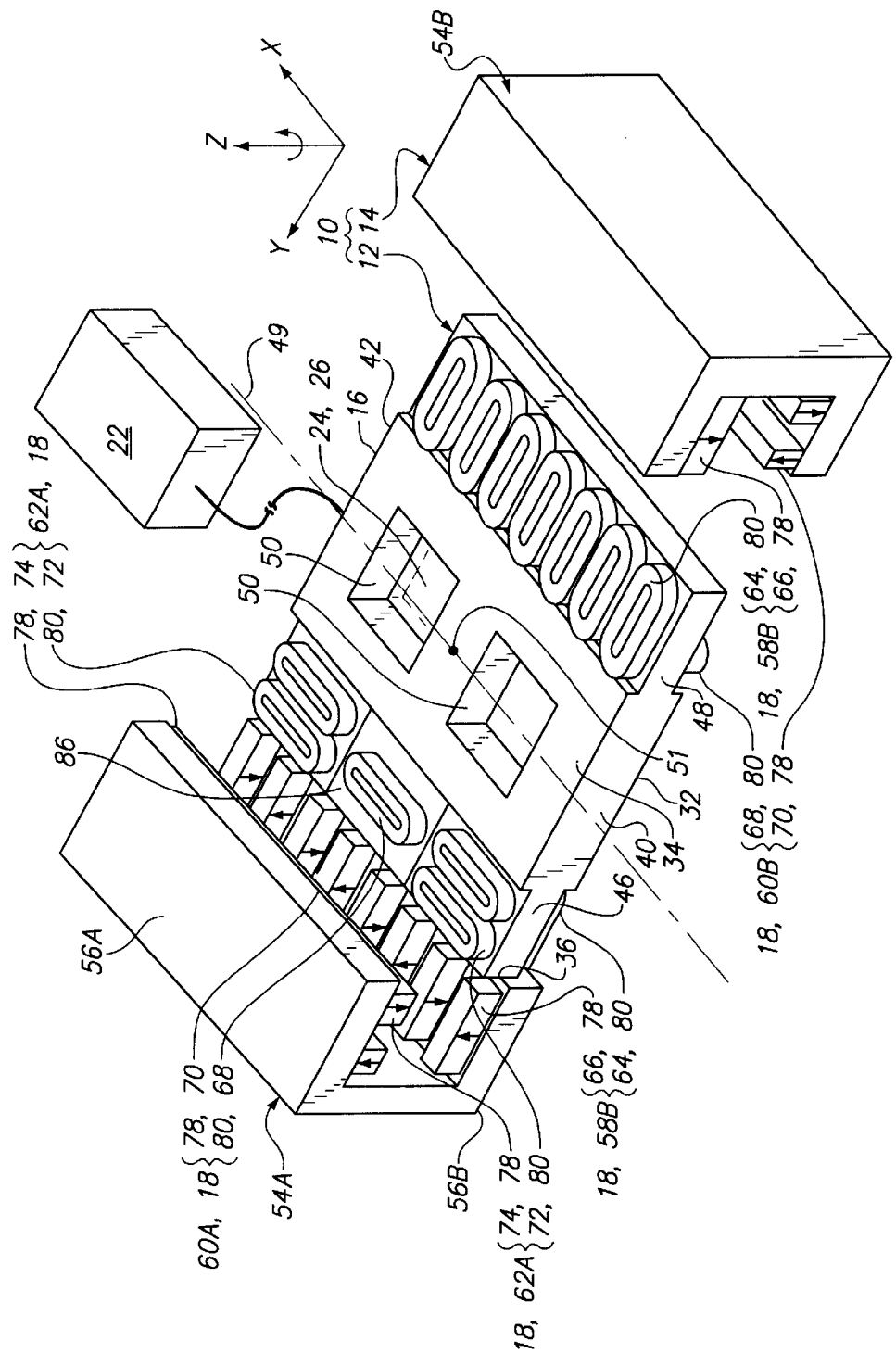
FIG. 2 is an exploded, top perspective view of the stage assembly of FIG. 1.
Figure 3:
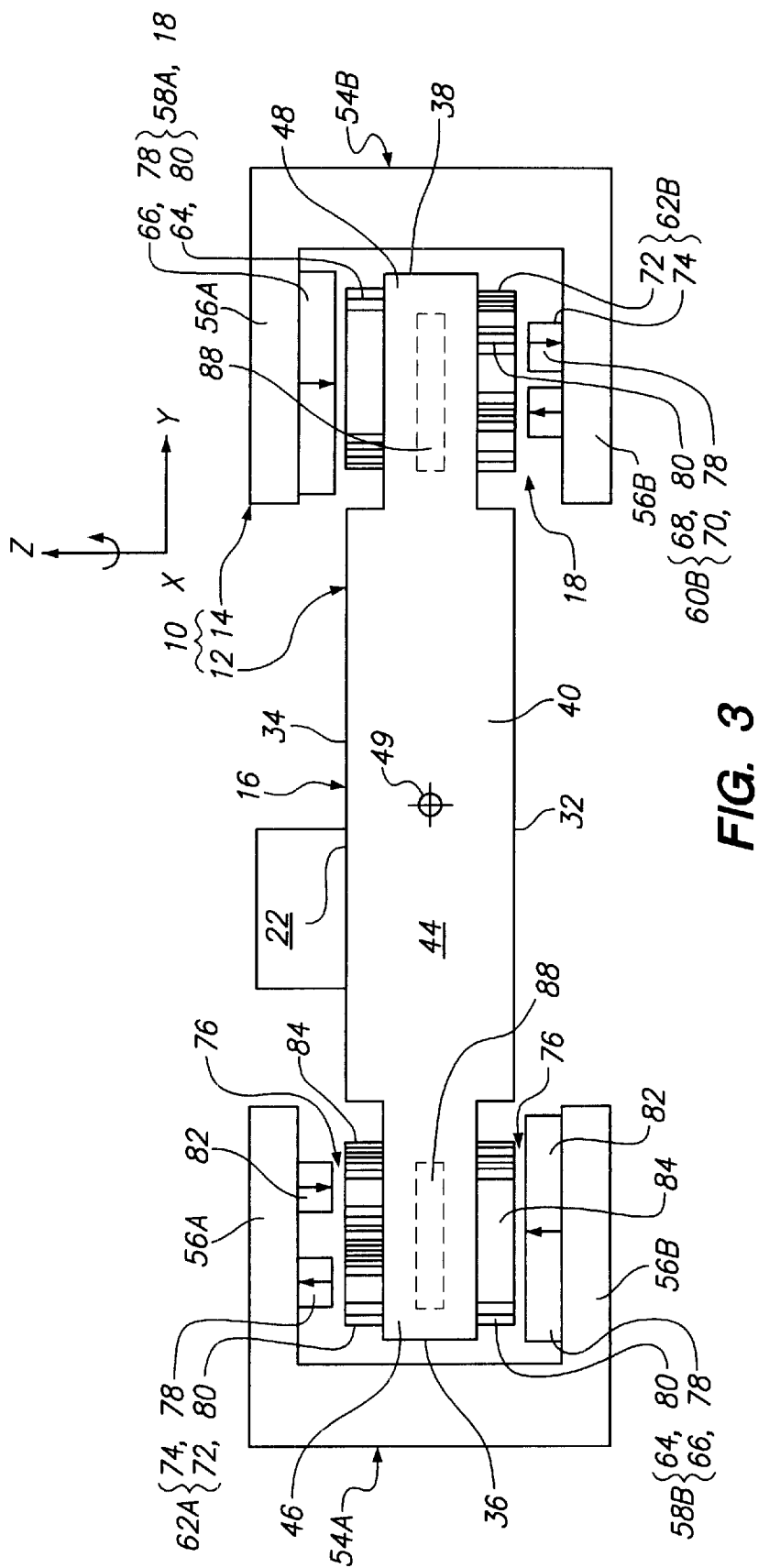
FIG. 3 is a side plan view of the stage assembly of FIG. 1.

Referring initially to FIGS. 1–3, a stage assembly 10 having features of the present invention includes a monolithic stage 12 and a mounting frame 14. The stage 12 includes a monolithic stage frame 16. A mover assembly 18 moves the stage frame 16 with at least three degrees of motion, and more preferably six degrees of motion relative to the mounting frame 14 and a mounting base 20 (illustrated in FIG. 14). A control system 22 controls the mover assembly 18 to precisely position the stage 12 relative to the mounting frame 14.

Because the stage frame 16 is monolithic, the number of movers in the mover assembly 18 is less than that of a comparable coarse-fine stage combination (not shown). This simplifies the design of the mover assembly 18 and the control system 22 for the mover assembly 18. Further, with this design, the mover assembly 18 generates less heat and consumes less energy.

Additionally, the monolithic stage frame 16 is relatively stiff and has a relatively high resonance frequency and a high servo bandwidth. Because of the high servo bandwidth of the stage 12, external forces and small reaction forces are less likely to influence the position of the stage 12. This allows for more accurate positioning of the stage 12.

The stage assembly 10 is particularly useful for precisely positioning one or more objects 24 during a manufacturing and/or an inspection process. The type of object 24 positioned and moved by the stage assembly 10 can be varied. In some of the embodiments provided herein, each object 24 is a reticle 26 and the stage assembly 10 is useful as part of an exposure apparatus 28 (illustrated in FIG. 14) for precisely positioning each reticle 26 during the manufacture of a device 30, e.g. a semiconductor wafer (illustrated in FIG. 14).

Figure 12:
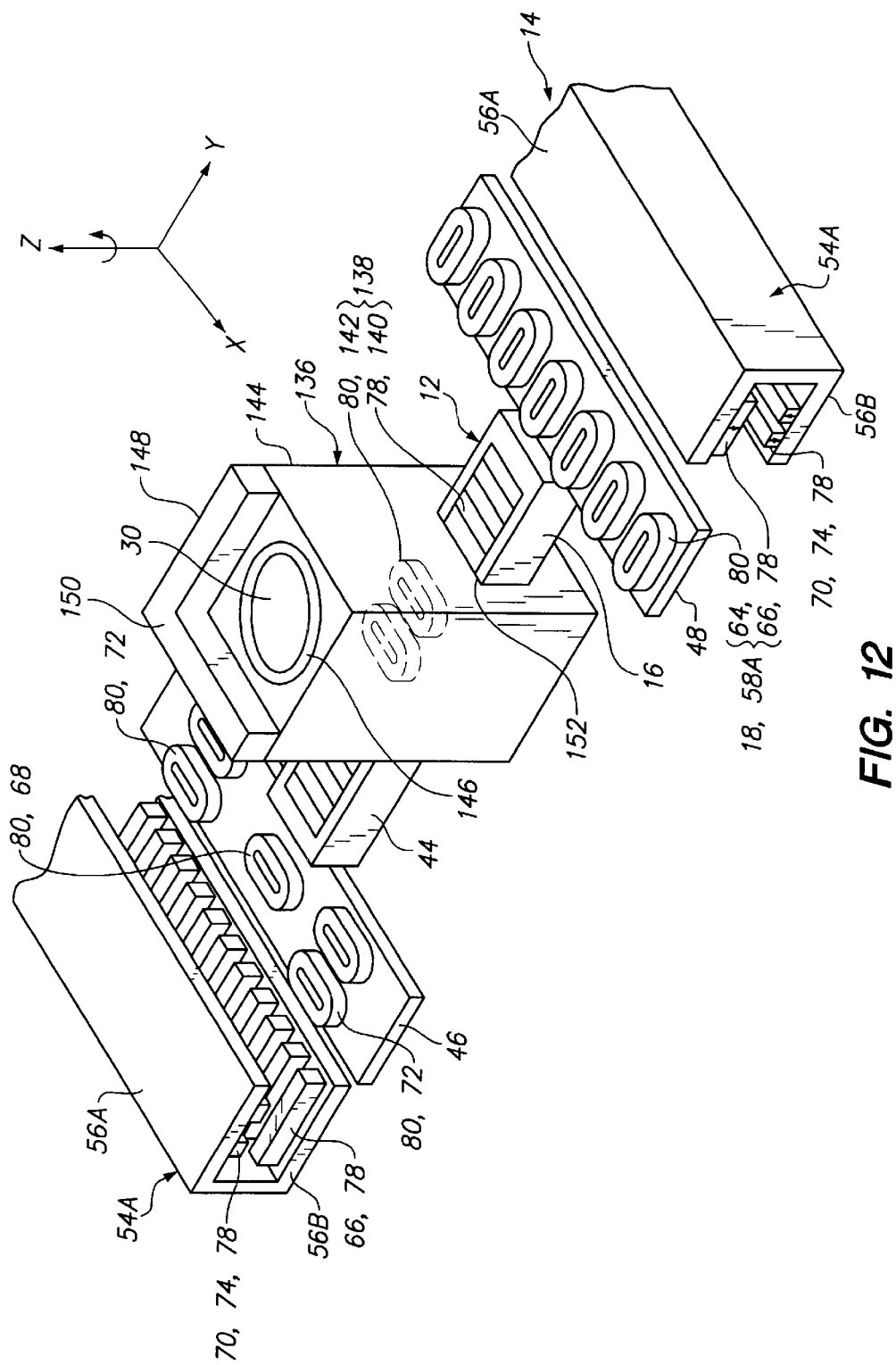
FIG. 12 is a perspective view of yet another embodiment of a stage assembly.

Alternately, as illustrated in FIG. 12, the stage assembly 10 can be used to move the wafer 30 during manufacturing. Still alternately, for example, the stage assembly 10 can be used to move a reticle 26 during reticle manufacturing, an object under an electron microscope (not shown), an object during a precision measurement operation (not shown), or an object 24 during a precision manufacturing operation.

Some of the Figures provided herein include a coordinate system that designates an X axis, a Y axis and a Z axis. It should be understood that the coordinate system is merely for reference and can be varied. For example, the X axis can be switched with the Y axis and/or the stage assembly 10 can be rotated. In the embodiment illustrated in the Figures, the X axis is the scan direction of the stage 12.

A number of alternate embodiments of the stage assembly 10 are illustrated in the Figures. In each embodiment, the stage assembly 10 includes the monolithic stage frame 16 that is moved by the mover assembly 18 with at least three degrees of motion. In the embodiments illustrated in the figures, the stage frame 16 is at least moved by the mover assembly 18 with a relatively large displacement along the X axis, a relatively small displacement along the Y axis, and a relatively small displacement about the Z axis (theta Z). However, the design of the stage assembly 10 and the degrees of freedom and movement of the stage 12 can be varied. For example, the stage assembly 10 can also be designed so that the mover assembly 18 moves the stage frame 16 with a relatively small displacement along the Z axis, a relatively small displacement about the X axis and a relatively small displacement about the Y axis.

FIGS. 1–3 illustrate a first embodiment of a stage assembly 10 having features of the present invention. In this embodiment, the stage frame 16 includes a frame bottom 32, a frame top 34, a frame first side 36, a frame second side 38 substantially opposite the frame first side 36, a frame front side 40 and a frame rear side 42 substantially opposite the frame front side 40. The stage frame 16 has (i) a generally rectangular shaped, main body section 44, (ii) a generally rectangular shaped first side section 46 that extends along the frame first side 36 and (iii) a generally rectangular shaped second side section 48 that extends along the frame second side 38. The stage frame 16 also includes a stage central axis 49 that extends between the frame front side 40 and the frame rear side 42, intermediate the frame first side 36 and the frame second side 38 and intermediate the frame top 34 and the frame bottom 32. A center of gravity 51 of the stage frame 16 is located on the stage central axis 49 intermediate the frame front side 40 and the frame rear side 42.

The stage frame 16 also includes one or more holders 50. Each holder 50 retains and secures one of the objects 24, e.g. reticles 26, to the stage 12. In the embodiment illustrated in the figures, each holder 50 is a rectangular shaped cut-out with vacuum chucks on either side. Alternately, for example, each holder 50 can be an electrostatic chuck, or some other type of clamp. The number of holders 50 can be varied. For example, in the embodiment illustrated in the Figures, the stage frame 16 includes two spaced apart holders 50. Because of the unique design provided herein, a relatively low mass stage 12 can be made that retains two reticles 26 (only one is illustrated in FIGS. 1 and 2). Alternately, the stage 12 could include a single holder 50 for retaining only one object 24.

The stage frame 16 illustrated in FIGS. 1–3 is made from a single piece of material that is machined to the required dimensions. The stage frame 16 can be made of a number of materials, including ceramics such as silicon carbide; metals such as aluminum, titanium, or steel; or a composite material. Because the stage frame 16 is preferably made from a single piece of material, the stage frame 16 is relatively stiff and has a relatively high servo bandwidth.

Figure 14:
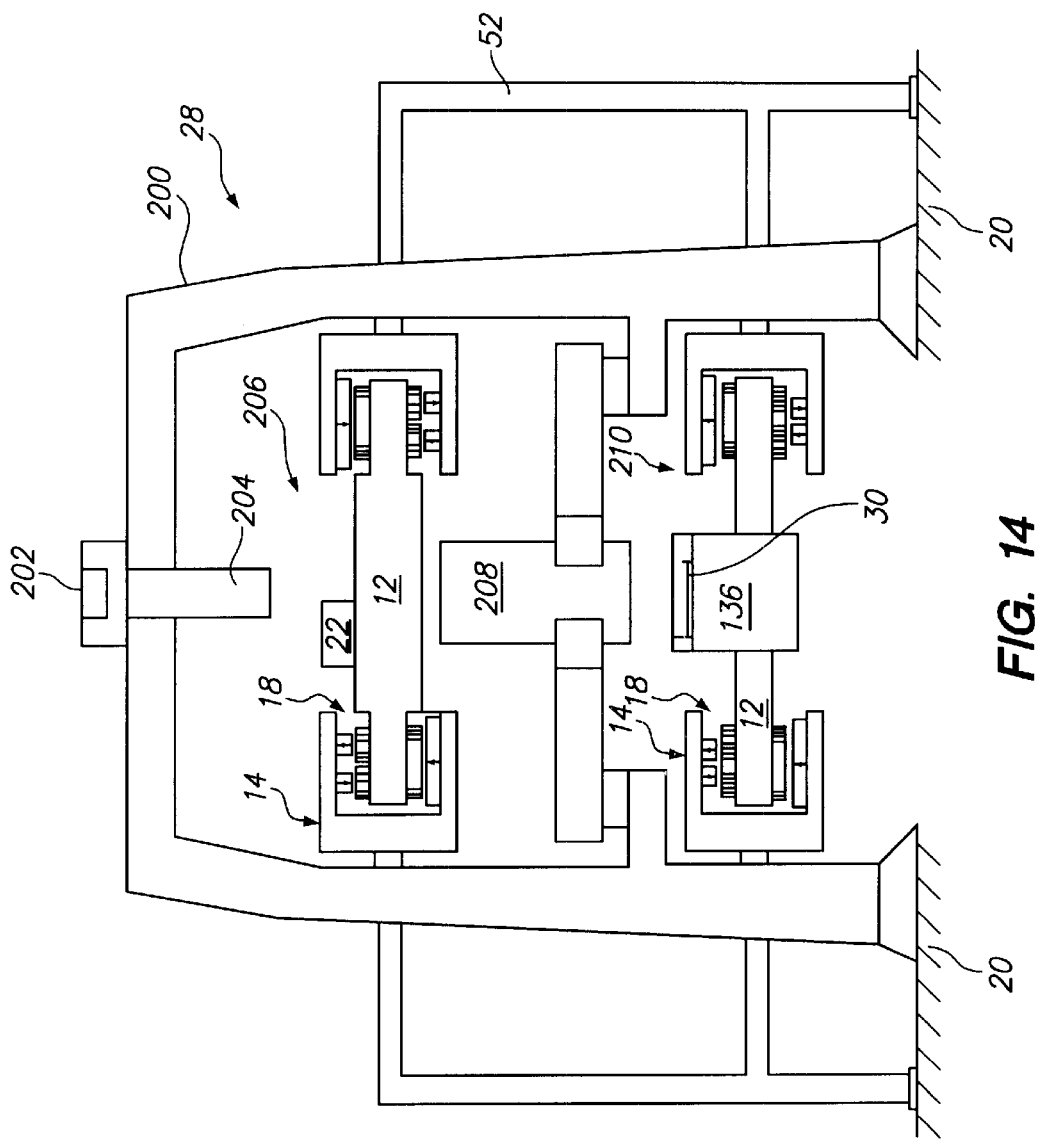
FIG. 14 is a schematic illustration of an exposure apparatus having features of the present invention.

The mounting frame 14 is secured above the mounting base 20 and retains a portion of the mover assembly 18 near the stage frame 16. The mounting frame 14 can be secured directly to the mounting base 20 with a reaction frame 52 as illustrated in FIG. 14 or the mounting frame 14 could be coupled to a reaction mass (not shown) above the mounting base 20.

The design of the mounting frame 14 can be varied to suit the design requirements of the stage assembly 10. A number of alternate designs of the mounting frame 14 are provided herein. In the embodiment illustrated in FIGS. 1–3, the mounting frame 14 includes a first frame body 54A and a spaced apart, second frame body 54B that are positioned on opposite sides 36, 38 of the stage frame 16. In this embodiment, each frame body 54A, 54B has a generally "C" shaped cross-section and includes an upper leg 56A and a lower leg 56B.

The design of the mover assembly 18 can be varied to suit the movement requirements of the stage 12. In the embodiment illustrated in FIGS. 1–3, the mover assembly 18 includes an upper X mover 58A, a lower X mover 58B, an upper Y mover 60A, a pair of lower Y movers 60B, a pair of upper Z movers 62A and a lower Z mover 62B. The movers 58A, 58B, 60A, 60B, 62A, 62B move the stage frame 16 along the X axis, along the Y axis, along the Z axis, about the X axis, about the Y axis and about the Z axis. More specifically, in this embodiment, (i) the X movers 58A, 58B move the stage frame 16 with a relatively large displacement along the X axis, (ii) the Y movers 60A, 60B move the stage frame 16 with a relatively small displacement along the Y axis and about the Z axis, and (iii) the Z movers 62A, 62B move the stage frame 16 with a limited range of motion along the Z axis, about X axis and about the Y axis. Alternately, for example, the X movers 58A, 58B could be used to move the stage frame 16 about the Z axis. Still alternately, a mover assembly 18 for a three degree of freedom stage 12 would utilize only the X movers 58A, 58B, and the Y movers 60A, 60B.

The design of each mover 58A, 58B, 60A, 60B, 62A, 62B can be varied to suit the movement requirements of the stage assembly 10. As provided herein, each X mover 58A, 58B includes a X stage component 64 and an adjacent X base component 66 that interacts with the X stage component 64. Each Y mover 60A, 60B includes a Y stage component 68 and an adjacent Y base component 70 that interacts with the Y stage component 68. Each Z mover 62A, 62B includes a Z stage component 72 and an adjacent Z base component 74 that interacts with the Z stage component 72.

The stage component 64, 68, 72 of each mover 58A, 58B, 60A, 60B, 62A, 62B is secured to the stage frame 16, moves with the stage frame 16 and is part of the stage 12. In contrast, the base component 66, 70, 74 of each mover 58A, 58B, 60A, 60B, 62A, 62B is secured to the mounting frame 14.

As an overview, in each embodiment illustrated herein, the stage component 64, 68, 72 moves relative to the corresponding base component 66, 70, 74 of each mover 58A, 58B, 60A, 60B, 62A, 62B. Further, a gap 76 (FIG. 3) exists between the stage component 64, 68, 72 and the corresponding base component 66, 70, 74 of each mover 58A, 58B, 60A, 60B, 62A, 62B. Typically, the gap 76 is between approximately one millimeter and five millimeters. However, depending upon the design of the particular mover 58A, 58B, 60A, 60B, 62A, 62B, a larger or smaller gap 76 may be utilized.

Additionally, in each embodiment, one of the components 64, 66, 68, 70, 72, 74 of each mover 58A, 58B, 60A, 60B, 62A, 62B includes one or more magnet arrays 78 and the other component 64, 66, 68, 70, 72, 74 of each mover 58A, 58B, 60A, 60B, 62A, 62B includes one or more conductor arrays 80.

Each magnet array 78 includes one or more magnets 82. The design of each magnet array 78 and the number of magnets 82 in each magnet array 78 can be varied to suit the design requirements of the mover 58A, 58B, 60A, 60B, 62A. 62B. The orientation of the magnets 82 is illustrated in the Figures with an arrow that is directed from a south pole towards a north pole. In the embodiments provided herein, each magnet 82 is substantially rectangular shaped. However, the shape of each magnet 82 can be varied.

Each conductor array 80 includes one or more conductors 84. The design of each conductor array 80 and the number of conductors 84 in each conductor array 80 is varied to suit the design requirements of the mover 58A. 58B, 60A, 60B, 62A, 62B. Each conductor 84 can be made of metal such as copper or any substance or material responsive to electrical current and capable of creating a magnetic field such as superconductors. In the embodiments illustrated herein each conductor 84 is a substantially annular shaped coil. Each coil typically includes a plurality of electrical wires encapsulated in an epoxy.

Electrical current (not shown) is individually supplied to each conductor 84 in each conductor array 80 by the control system 22. The electrical current in each conductor 84 interacts with a magnetic field (not shown) generated by the one or more of the magnets 82 in the magnet array 78. This causes a force (Lorentz force) between the conductors 84 and the magnets 82 that can be used to move the stage 12 relative to the mounting frame 14.

Specifically, the X stage component 64 and the X base component 66 of each X mover 58A, 58B interact to selectively move the stage frame 16 along the X axis relative to the mounting frame 14. In the embodiments illustrated in the FIGS. 1–3, each X mover 58A, 58B is a linear motor. The X stage component 64 for each X mover 58A, 58B is secured to and extends along the length of the stage frame 16 and the X base component 66 for each X mover 58A. 58B is secured to and extends along the length of one of the legs 56A, 56B of one of the frame bodies 54A, 54B. More specifically, for the upper X mover 58A, (i) the X stage component 64 is secured to and extends along the second side section 48 and the frame top 34 of the stage frame 16 near the frame second side 38, and (ii) the X base component 66 is secured to and extends along the upper leg 56A of the second frame body 54B. For the lower X mover 58B, (i) the X stage component 64 is secured to and extends along first side section 46 and the frame bottom 32 of the stage frame 16 near the frame first side 36, and (ii) the X base component 66 is secured to and extends along the lower leg 56B of the first frame body 54A.

Figure 4:
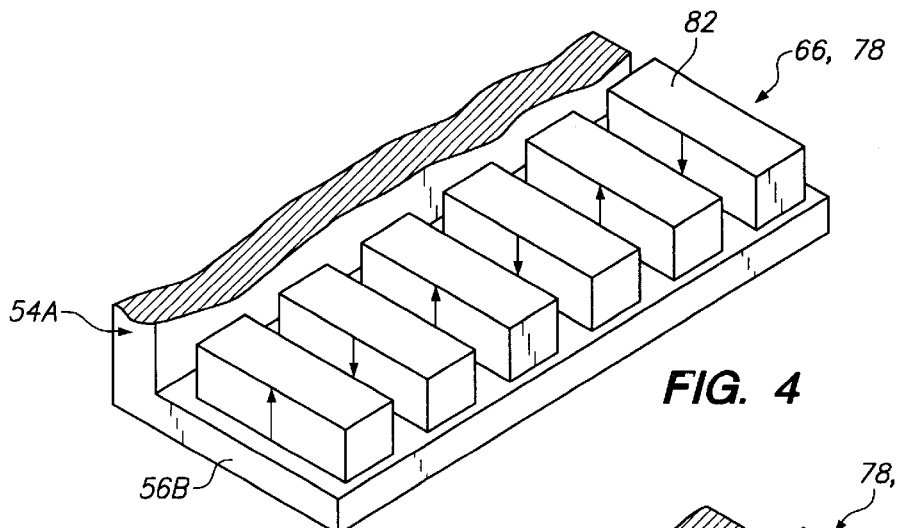
FIG. 4 is a perspective view of a X base component and a portion of a frame body having features of the present invention.

In these embodiments, the X stage component 64 of each X mover 58A, 58B includes a conductor array 80 having a plurality of spaced apart conductors 84 while the X base component 66 of each X mover 58A, 58B includes a magnet array 78 including a plurality of magnets 82. A suitable magnet array 78 for the X base component 66 of each X mover 58A, 58B is illustrated in FIG. 4. Alternately, for example, the X base component could include a conductor array and the X stage component could includes a magnet array. Still alternately, the upper X mover 58A could be moved to the first side section 46 and the lower X mover 58B could be moved to the second side section 48.

With this design, the X movers 58A, 58B make relatively large displacement adjustments to the position of the stage frame 16 and the one or more objects 24 along the X axis. The required stroke of the stage 12 along the X axis will vary according to the number of objects 24 retained by the stage 12 and the use of the stage assembly 10. More specifically, for an exposure apparatus 28, generally, the stroke of the X movers 58A, 58B along the X axis will need to be increased as the number of objects 24 is increased. A suitable stroke along the X axis for a stage assembly 10 moving a single reticle 26 is between approximately 250 millimeters and 350 millimeters while a suitable stroke for two reticles 26 is between approximately 450 millimeters and 550 millimeters.

The X movers 58A, 586 are uniquely positioned to minimize or eliminate torque about the Z axis or a force along the Y axis. More specifically, the X movers 58A, 58B are diametrically opposed relative to the stage central axis 49 and the center of gravity 51. Stated another way, each X mover 58A, 58B is the same distance along the X axis and the Z axis away from the center of gravity 51 and the stage central axis 49. With this design, the X movers 58A, 58B do not generate a significant torque about the Y axis or a significant force along the Y axis. This feature allows the Z movers 62A, 62B to better control the movement of the stage frame 16 about the Y axis and the Y movers 60A, 60B to better control the movement of the stage frame 16 along the Y axis. Additionally, as a result of this design, smaller and lighter Z movers 62A, 62B and Y movers 60A, 60B can be used. The smaller movers 60A, 60B, 62A, 62B generate less heat and consume less energy.

The Y movers 60A, 60B selectively move the stage frame 16 along the Y axis and about the Z axis relative to the mounting frame 14. Stated another way, the Y movers 60A, 60B make relatively slight adjustments to the position of the stage frame 16 and the one or more objects 24 along the Y axis and about the Z axis. The required stroke of the Y movers 60A, 60B will vary according to use of the stage assembly 10. A suitable stroke along the Y axis for a stage assembly 10 for an exposure apparatus 28 moving a single reticle 26 is between approximately 1 and 5 millimeters.

In the embodiments illustrated in the FIGS. 1–3, each Y mover 60A, 60B is an actuator, commonly referred to as a voice coil actuator. The Y stage component 68 for each Y mover 60A, 60B is secured to the stage frame 16 and the Y base component 70 for each actuator is secured to one of the legs 56A, 56B of one of the frame bodies 54A, 54B. More specifically, the Y stage component 68 for the upper Y mover 60A is secured to first side section 46 and the frame top 34 of the stage frame 16 near the frame first side 36, intermediate the frame front side 40 and the frame rear side 42. The Y base component 70 for the upper Y mover 60A is secured to the upper leg 56A of the first frame body 54A. Each lower Y mover 60B includes a Y stage component 68 secured to the second side section 48 and the frame bottom 32 of the stage frame 16 near the frame second side 38. One of the Y stage components 68 for one of the lower Y movers 60B is positioned near the frame front side 40 and the other Y stage component 68 for the other lower Y movers 60B is positioned near the frame rear side 42. Additionally, in the embodiment illustrated in FIGS. 1–3, the two lower Y movers 60B include a single, Y base component 70 that extends along and is secured to the lower leg 56B of the second frame body 54B.

Figure 5:
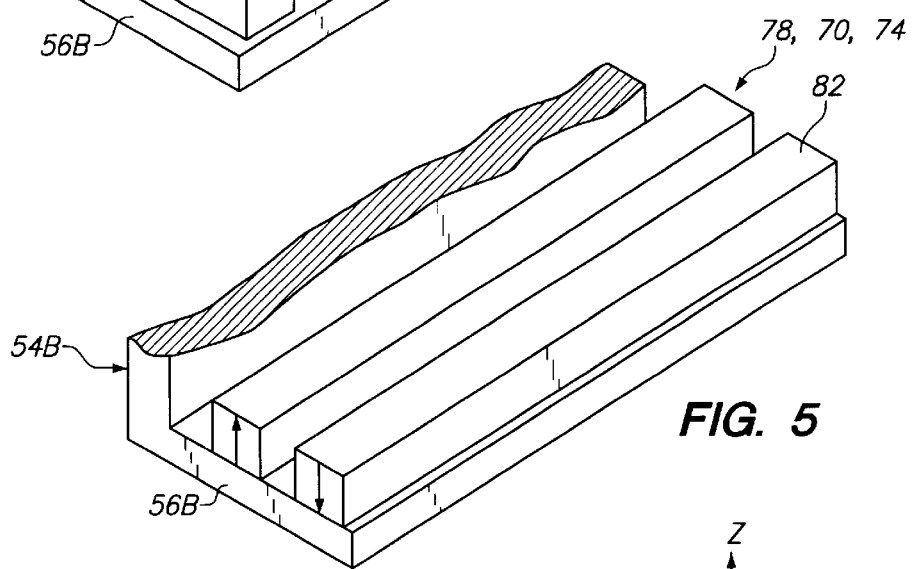
FIG. 5 is a perspective view of a Y base component and Z base component and a portion of a frame body having features of the present invention.

In the embodiments illustrated in the Figures, the Y stage component 68 of each Y mover 60A, 60B includes a conductor array 80 having a single conductor 84 while the Y base component 70 of each Y mover 60A, 60B includes a magnet array 78 having a pair of magnets 82. A suitable magnet array 78 for the Y base component 70 is illustrated in FIG. 5. Alternately, the Y base component can include a conductor array and the Y stage component can include a magnet array. Still alternately, the mover assembly 18 could include two upper Y movers and only one lower Y mover.

In some embodiments, a plate 86 is positioned behind the conductor array 80 of each Y stage component 68 to straighten flux lines near the Y stage component 68. A suitable plate 86 is made of magnetic material such as iron.

The Y movers 60A, 60B are uniquely positioned to minimize or eliminate torque about the Y axis or a torque about the X axis. More specifically, the upper Y mover 60A and the lower Y movers 60B are diametrically opposed relative to the stage central axis 49 and the center of gravity 51. Stated another way, each Y mover 60A, 60B is the same distance along the X axis and the Z axis away from the stage central axis 49. With this design, the Y movers 60A, 60B do not generate a significant torque about the Y axis or a significant torque about the X axis. This feature allows the Z movers 62A, 62B to better control the movement of the stage 12 about the X axis, about the Y axis and the X movers 58A, 58B to better control the movement of the stage 12 along the X axis. Additionally, as a result of this design, smaller and lighter Z movers 62A, 62B and X movers 58A, 58B can be used. The smaller movers 58A, 58B, 62A, 62B generate less heat and consume less energy.

The Z movers 62A, 62B make relatively slight adjustments to the position of the stage 12 and the one or more objects 24 along the Z axis, around the X axis and around the Y axis relative to the mounting frame 14. In the embodiments illustrated in the FIGS. 1–3, each Z mover 62A, 62B is an actuator that is slightly different than the actuator utilized for the Y movers 60A, 60B. The Z stage component 72 for each Z mover 62A, 62B is secured to the stage frame 16 and the Z base component 74 for each actuator is secured to one of the legs 56A, 56B of one of the frame bodies 54A, 54B.

More specifically, each upper Z mover 62A includes a Z stage component 72 secured to the first side section 46 and the frame top 34 near the frame first side 36. One of the Z stage components 72 for one of the upper Z movers 62A is positioned near the frame front side 40 and the other Z stage component 68 for the other upper Z mover 62A is positioned near the frame rear side 42. Stated another way, the Y stage component 68 for the upper Y mover 60A is positioned between the Z stage components 68 for the upper Z movers 62A. Additionally, in the embodiment illustrated in FIGS. 1–3, the two upper Z movers 62A include a single, Z base component 72 that extends along and is secured to the upper leg 56A of the first frame body 54A.

The Z stage component 72 for the lower Z mover 62B is secured to the second side section 48 and the frame bottom 32 of the stage frame 16 near the frame second side 38, intermediate the frame front side 40 and the frame rear side 42. The Z stage component 72 for the lower Z mover 62B is positioned intermediate the Y stage components 68 for the lower Y movers 60B. The Z base component 74 for the lower Z mover 62B is secured to and extends along the lower leg 56B of the second frame body 54B.

In the embodiment illustrated in FIGS. 1–3, the Z stage component 72 of each the Z mover 62A, 62B includes a conductor array 80 having a pair of adjacent conductors 84 while the Z base component 74 includes a magnet array 78 including a pair of magnets 82. A suitable magnet array 78 for the Z base component 74 is illustrated in FIG. 5. It should be noted that the same magnet array 78 is used for the Y base component 70 of the upper Y mover 60A and the Z base component 74 for the upper 74 movers 62A. Similarly, the same magnet array 78 is used for the Y base component 70 of the lower Y movers 60B and the Z base component 74 for the lower Z mover 62B. Alternately, the Z movers could be designed so that the Z base component includes a conductor array and Z stage component includes a magnet array. Still alternately, for example, the mover assembly 18 could include two lower Z movers and only one upper Z mover.

Importantly, in the design illustrated in FIGS. 1–3, the pair of adjacent conductors 84 of the Z stage component 72 are offset from the single conductor 84 of the Y stage component 68. As a result thereof, the adjacent conductors 84 of the Z stage component 72 interact with the flux generated by the magnet array 78 at a different angle than the conductor 84 of the Y stage component 68. With this design, the Z movers 62A, 62B can generate a force along the Z axis, about the Y axis and about the X axis while the Y movers can generate a force along the Y axis and about the Z axis.

The required stroke of each Z mover 62A, 62B will vary according to use of the stage assembly 10. A suitable stroke for each Z mover 62A, 62B for a stage assembly 10 for an exposure apparatus 28 moving a single reticle 26 is between approximately 0.1 and 0.3 millimeters.

It should be noted that the movers 58A, 58B, 60A, 60B, 62A, 62B of the mover assembly 18 are uniquely arranged around the stage 12. In particular, the upper X mover 58A is positioned directly above the lower Y movers 60B and the lower Z mover 62B. Somewhat similarly, the upper Y mover 60A and the upper Z movers 62A are positioned directly above the lower X mover 58B.

The control system 22 controls the X movers 58A, 58B, the Y movers 60A, 60B and the Z movers 62A, 62B to precisely move the stage 12 relative to the mounting frame 14. In the embodiment illustrated in FIGS. 1–3, the control system 22 directs and controls the current to X stage component 64 for each of the X mover 58A, 58B to control movement of the stage 12 along the X axis. Similarly, the control system 22 directs and controls the current to Y stage component 68 for each of the Y mover 60A, 60B to control movement of the stage 12 along the Y axis and about the Z axis. Finally, the control system 22 directs and controls the current to Z stage component 72 for each of the Z mover 62A, 62B to control movement of the stage 12 about the X axis, about the Y axis and along the Z axis.

It should be noted that the stage 12, illustrated in FIGS. 1–3, is able to move with six degrees of freedom. More specifically, the stage 12 is guideless and not constrained (i) along the Y axis, the X axis, and the Z axis, and (ii) about the Y axis, the X axis and the Z axis. With this design, the control system 22 controls the mover assembly 18 to position the stage 12 along the X axis, Y axis, and the Z axis, and about the Y axis, the X axis and the Z axis. This allows for more accurate positioning of the stage 12 and better performance of the stage assembly 10. Alternately, the stage 12 may be designed to move with only three degrees of freedom. In this design, the Z movers are not necessary because the stage 12 in not free to move along the Z axis, about the X axis and about the Y axis.

The stage 12 can be supported spaced apart from the mounting frame 14 by a number of alternate ways. For example, in the embodiment illustrated in FIGS. 1–3, the stage 12 is supported by the movers 58A, 58B, 60A, 60B, 62A, 62B spaced apart from the mounting frame 14. This is commonly referred to as a magnetic type bearing and allows for six degrees of freedom of the stage 12 relative to the mounting frame 14. With this design, the Z movers 62A, 62B support the stage 12 spaced apart from the mounting frame 12. Further, with this design, the Z movers 62A, 62B can adjust the position of the stage 12 relative to the mounting frame 14 along the Z axis, about the X axis and about the Y axis.

Referring to FIG. 3, a pair of magnetic components 88 (illustrated in phantom) can be added to the stage 12 to provide an upward lift to the stage 12. In the design illustrated in FIG. 3, one of the magnetic components 88 is positioned in each of the side sections 46, 48. Each magnetic component 88 is made of a magnetic material. With this design, the magnetic components 88 interact with the magnetic arrays 78 of the upper movers 58A, 60A and 62A and the magnetic arrays 78 of the lower movers 58B, 60B and 62B to support and balance the stage frame 16 there between.

Importantly, the gap 76 between the magnets 82 of the upper movers 58A, 60A, 62A and the gap 76 between the magnets 82 of the lower movers 58B, 60B, 62B can be modified by modifying the position of the magnetic components 88 in the stage frame 16. With the design provided herein, the distance between the magnetic components 88 and the magnets 82 of the upper movers 58A, 60A, 62A is larger than the distance between the magnetic components 88 and the magnets 82 of the lower movers 58B, 60B, 62B to provide an upward force substantially equal the weight of the stage 12.

Preferably, the magnetic components 88 are positioned to balance the weight of the stage 12 and allow the stage 12 to be neutrally buoyant. With this design, the Z movers 62A, 62B are not needed to support the stage frame 16 and are only used to make slight adjustments to the position of the stage frame 16 along the Z axis, about the Y axis and about the X axis. As a result thereof, smaller Z movers 62A, 62B could be utilized, less energy is used by the Z movers 62A, 62B and less heat is generated by the Z movers 62A, 62B.

Figure 6:
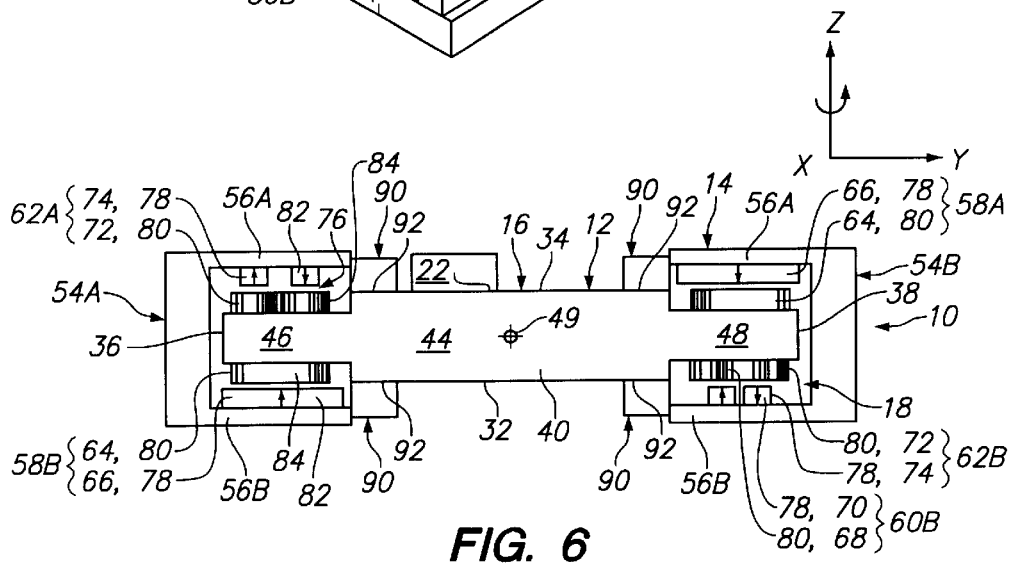
FIG. 6 is a side plan view of another embodiment of a stage assembly having features of the present invention.

Alternately, for example, the stage 12 can be supported spaced apart from the mounting frame 14 by a fluid bearing. FIG. 6 illustrates one embodiment of the stage 12 supported a fluid bearing. More specifically, in this design, each leg 56A, 56B of each frame body 54A, 54B includes a bearing block 90 that extends the length of each leg 56A, 56B. Each bearing block 90 includes a bearing surface 92 that is positioned adjacent to the stage 12. The stage 12 includes a plurality of spaced apart fluid outlets (not shown). Pressurized fluid (not shown) is released from the fluid outlets towards bearing surface 92 of each bearing block 90 to create a fluid bearing between the bearing blocks 90 and the stage 12. The fluid bearing maintains the stage 12 spaced apart along the Z axis relative to the mounting frame 14 and allows for motion of the stage 12 along the X axis, the Y axis and about the Z axis relative to the mounting frame 14.

Figure 7:
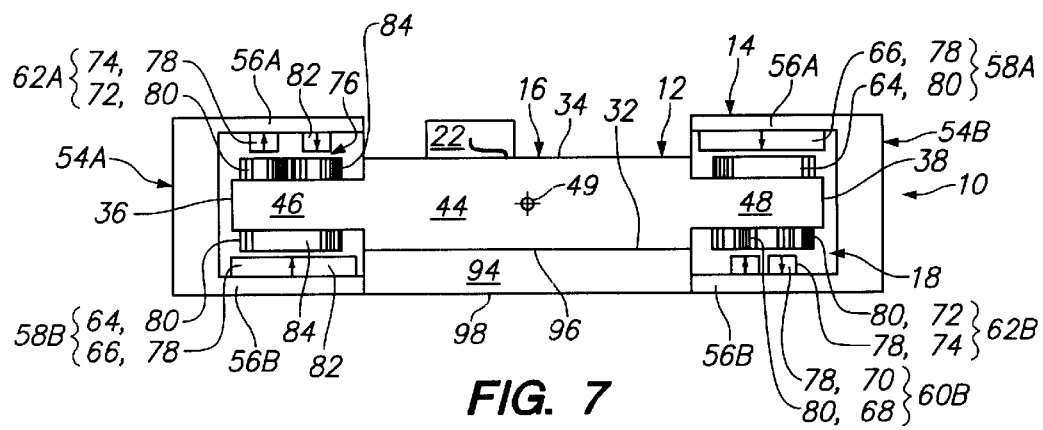
FIG. 7 is a side plan view of yet another embodiment of a stage assembly having features of the present invention.

FIG. 7 illustrates an alternate embodiment of a fluid bearing used in a stage assembly 10. In this embodiment, the stage assembly 10 includes a stage base 94 that supports the stage 12 during movement. The design of the stage base 94 can be varied to suit the design requirements of the stage assembly 10. In the embodiment illustrated in FIG. 7, the stage base 94 includes a planar, upper surface 96 and a spaced apart, lower surface 98. In this design, the frame bottom 32 of the stage frame 16 includes a plurality of spaced apart, fluid outlets (not shown) and a plurality of spaced apart, fluid inlets (not shown). Pressurized fluid (not shown) is released from the fluid outlets towards the upper surface 96 of the stage base 94 and a vacuum is pulled in the fluid inlets to create a vacuum preload type, fluid bearing between the stage 12 and the stage base 94. The vacuum preload type, fluid bearing maintains the stage 12 spaced apart along the Z axis relative to the stage base 12 and allows for motion of the stage 12 along the X axis, the Y axis and about the Z axis relative to the stage base 94.

Figure 8:
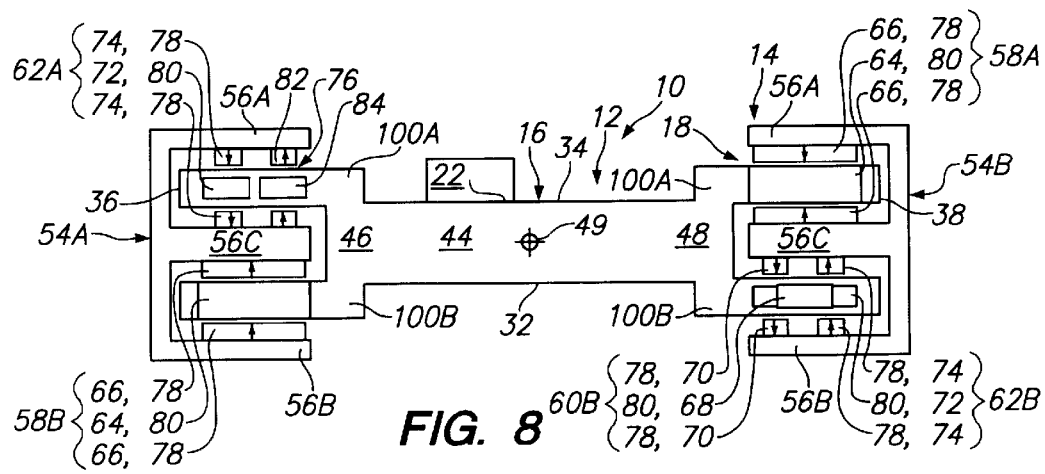
FIG. 8 is a side plan view of still another embodiment of a stage assembly having features of the present invention.

FIG. 8 illustrates another embodiment of a stage assembly 10. In this embodiment, (i) each side section 46, 48 of the stage frame 16 is substantially "C" shaped and includes an upper beam 100A and a lower beam 100B and (ii) each frame body 54A, 54B is substantially "E" shaped and includes an intermediate leg 56C that is positioned between the upper leg 56A and the lower leg 56B. In the embodiment illustrated in FIG. 8, each stage component 64, 68, 72 is positioned between a pair of spaced apart, base components 66, 70, 74. More specifically, each X stage component 64 is positioned between a pair of X base components 66, each Y stage component 68 is positioned between a pair of Y base components 70 and each Z stage component 72 is positioned between a pair of Z base components 74. In FIG. 8, the stage components 64, 68, 72 are conductor arrays 80 and the base components 66, 70, 74 are magnet arrays 78. Alternately, the stage assembly could be designed so that the stage components include magnet arrays and the base components include conductor arrays.

Figure 9:
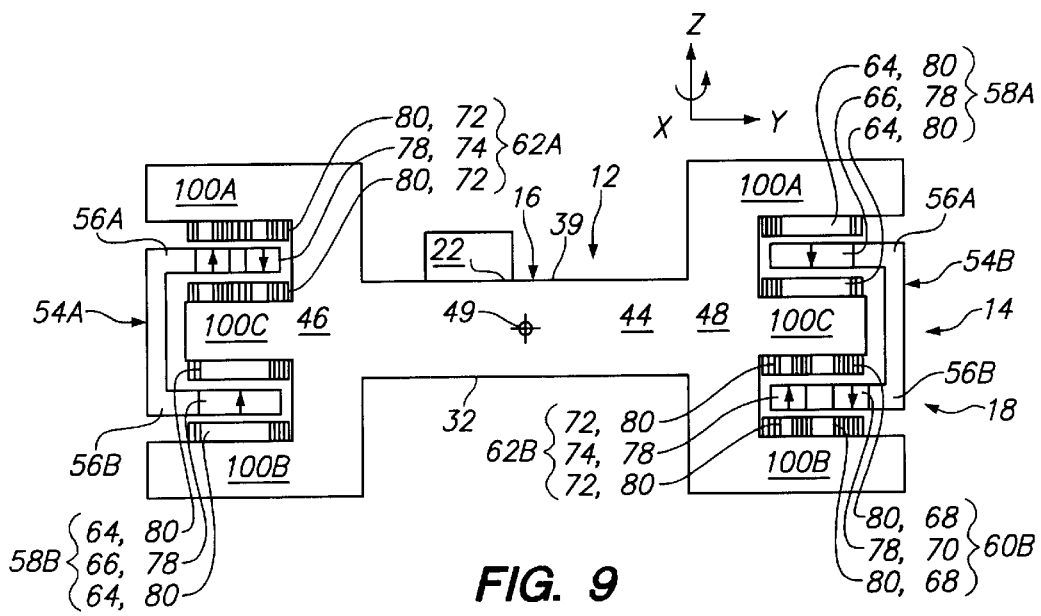
FIG. 9 is a side plan view of yet another embodiment of a stage assembly having features of the present invention.

FIG. 9 illustrates another embodiment of a stage assembly 10. In this embodiment, (i) each side section 46, 48 of the stage frame 16 is substantially "E" shaped and includes an intermediate beam 100C that is positioned between the upper beam 100A and the lower beam 100B and (ii) each frame body 54A, 54B is substantially "C" shaped and includes the upper leg 56A and the lower leg 56B. With this design, each base component 66, 70, 74 is positioned between a pair of spaced apart stage components 64, 68, 72. More specifically, each X base component 66 is positioned between a pair of X stage components 64, each Y base component 70 is positioned between a pair of Y stage components 68 and each Z base component 74 is positioned between a pair of Z stage components 72.

In FIG. 9, the stage components 64, 68, 72 are conductors 84 and the base components 66, 70, 74 are magnets 82. However, stage assembly illustrated in FIG. 9 could be designed so that the stage components include magnets 82 and the base components include conductors 84.

Figure 10A:
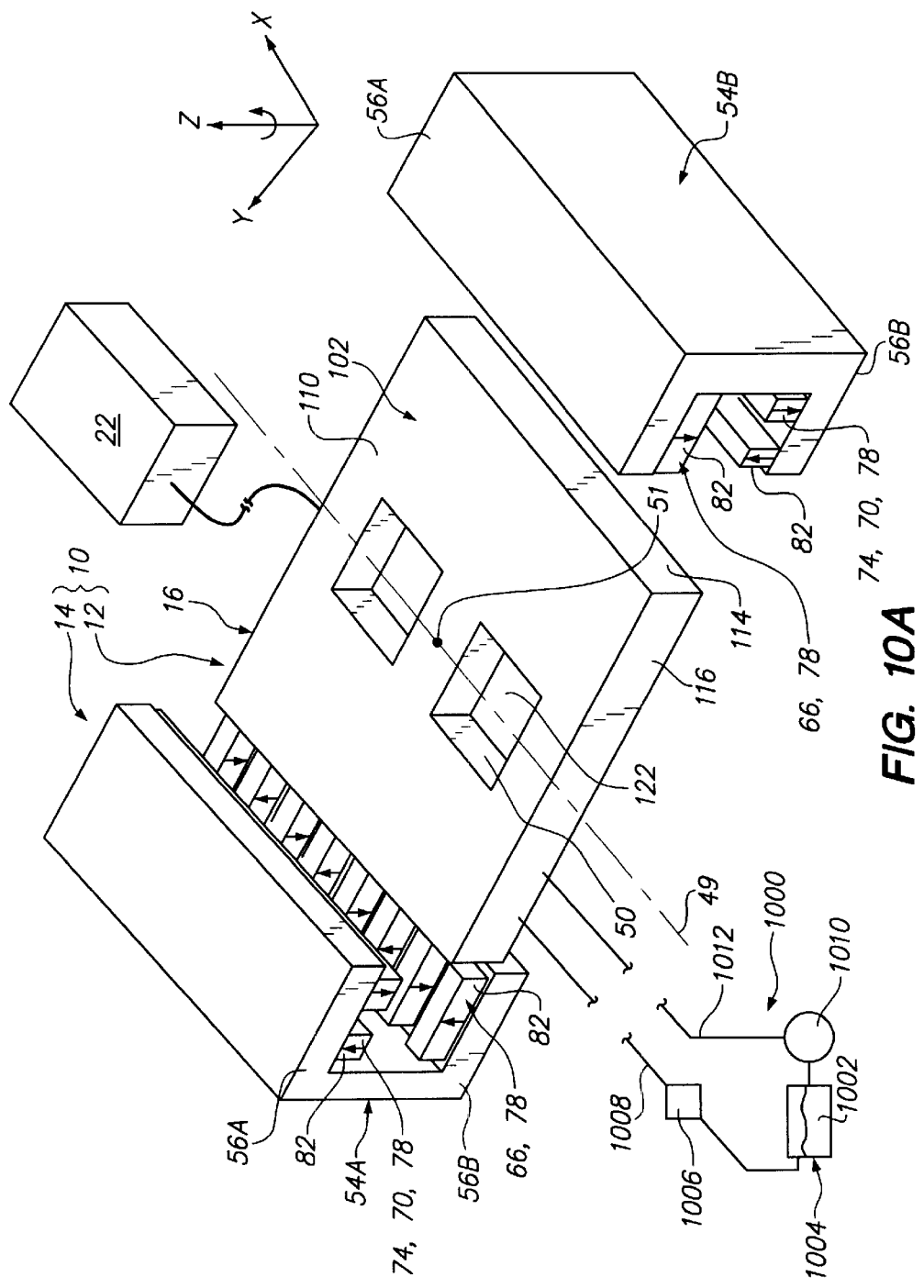
FIG. 10A is a partly exploded, top perspective view of another embodiment of a stage assembly including a stage having features of the present invention.
Figure 10B:
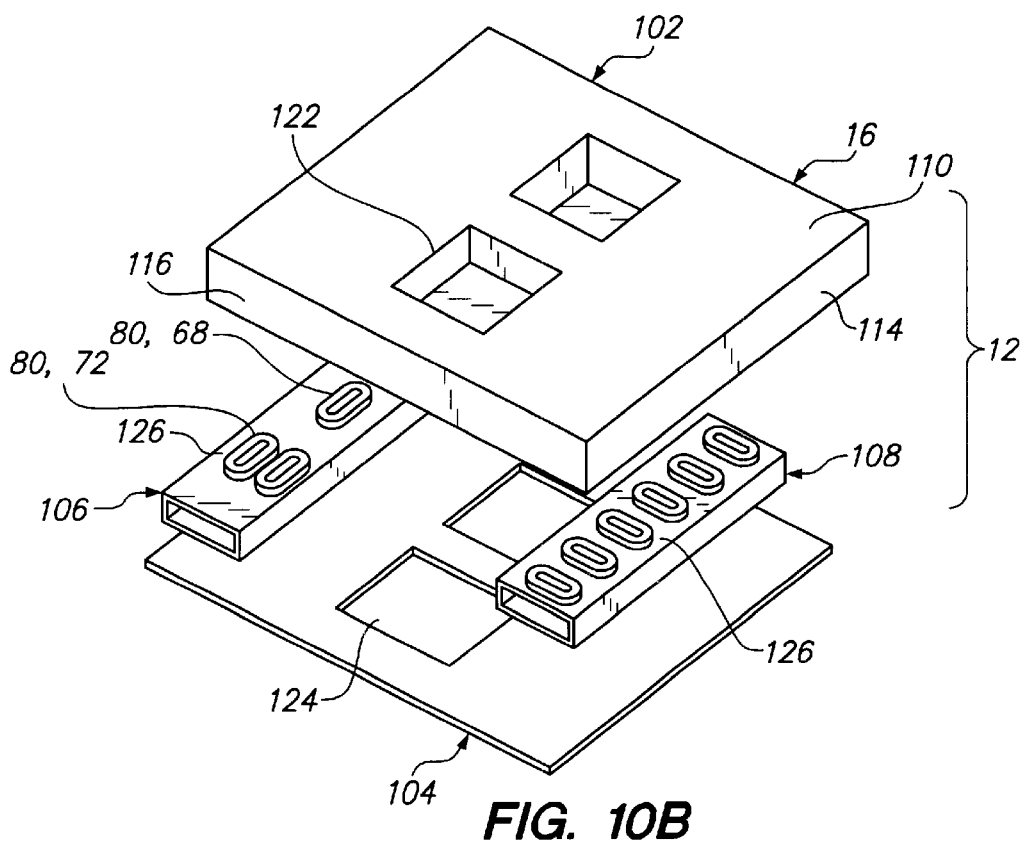
FIG. 10B is a partly exploded, top perspective view of the stage of FIG. 10A.
Figure 10C:
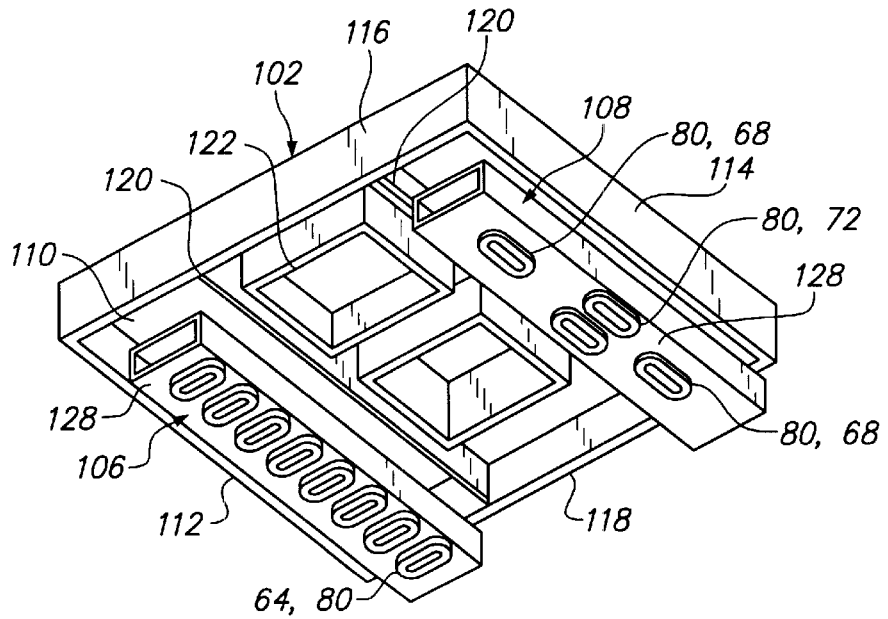
FIG. 10C is a partly exploded, bottom perspective view of the stage of FIG. 10A.

FIGS. 10A–10C illustrate yet another embodiment of the present invention. In particular, FIG. 10A illustrates an exploded perspective view of the stage assembly 10, FIG. 10B illustrates an exploded, upper perspective view of the stage 12 and FIG. 10C illustrates an exploded, lower perspective view of the stage 12.

The mounting frame 14 and mover assembly 18 in this embodiment are substantially similar to that illustrated in FIGS. 1–3 and described above. However, the stage 12 is different from that illustrated in FIGS. 1–3. More specifically, as illustrated in FIGS. 10B, and 10C, the stage 12 includes a rectangular, hollow stage frame 16. More specifically, the stage frame 16 includes an upper section 102, a lower section 104, a first mover support 106 and a second mover support 108. The upper section 102 includes a substantially planar top 110, a first side wall 112, a second side wall 114, a front side wall 116, and a rear side wall 118. Each side wall 112, 114, 116, 118 is planar shaped. The side walls 112, 114, 116, 118 cooperate to form a rectangular tube shaped structure that cantilevers and extends downward from the planar top 110.

The upper section 102 also includes a pair of spaced apart, planar, intermediate walls 120 and a pair of rectangular shaped channels 122. The intermediate walls 120 extend downward from the top 110 intermediate the first side wall 112 and the second side wall 114. More specifically, one of the intermediate walls 120 is positioned between the first side wall 112 and the channels 122 and the other intermediate wall 120 is positioned between the second side wall 114 and the channels 122. Each channel 122 extends through the stage frame 16 and includes a holder (not shown) such as a vacuum chuck, an electrostatic chuck or some other type of clamp to retain an object 24 (not shown in FIGS. 10A–10C).

The lower section 104 is substantially planar shaped and includes a pair of spaced apart openings for the channels 122. The lower section 104 is secured to the bottom of the side walls 112, 114, 116, 118, the intermediate wall 120, and channels 122 to form the hollow, rectangular, stage frame 16.

The mover supports 106, 108 provide support and easy mounting of the stage components 64, 68, 72 of the movers 58A, 58B, 60A, 60B, 62A, 62B to the stage frame 16. In the embodiment illustrated in FIGS. 10B and 10C, each mover support 106, 108 is rectangular tube shaped and includes an upper mounting surface 126 and a lower mounting surface 128. The first mover support 106 is positioned (i) between the top 110 and the lower section 104 and (ii) between the first side wall 112 and one of the intermediate walls 120. The second mover support 108 is positioned (i) between the top 110 and the lower section 104 and (ii) between the second side wall 114 and one of the intermediate walls 120.

As illustrated in FIGS. 10B–10C, the stage components 64, 68, 72 of the movers 58A, 58B, 60A, 60B, 62A, 62B can be secured to the mover supports 106, 108 in a similar layout as that illustrated in FIGS. 1–3. In particular, (i) a pair of spaced apart Z stage components 72 and a Y stage component 68 are secured to the upper mounting surface 126 of the first mover support 106, (ii) a X stage component 64 is secured to the lower mounting surface 128 of the first mover support 106, (iii) a X stage component 64 is secured to the upper mounting surface 126 of the second mover support 108, and one Z stage component 72 and a pair of spaced apart Y stage components 68 are secured to the lower mounting surface 128 of the second mover support 108. With this design the mover assembly 18 can move the stage 12 with a relatively large displacement along the X axis, a limited displacement along the Y axis, and a limited displacement about the Z axis (theta Z).

Because the stage frame 16 is hollow, the resulting stage frame 16 is relatively light in mass, strong and has a high mechanical resonance frequency resulting in a high servo bandwidth. Because of the low mass of the stage frame 16, smaller movers 58A, 58B, 60A, 60B, 62A, 62B can be used to move the stage frame 16. The smaller movers 58A, 58B, 60A, 60B, 62A, 62B generate less heat and consume less energy. Because of the high servo bandwidth of the stage 12, external forces and small reaction forces are less likely to influence the position of the stage 12. This allows for more accurate positioning of the stage 12.

Additionally, the present invention can include a circulating system 1000 (illustrated in FIG. 10A) for cooling the conductors 84 in the movers 58A, 58B, 60A, 60B, 62A, 62B. More specifically, the circulating system 1000 forces or directs a fluid 1002 near the conductors 84. The design of the circulating system 1000 can be varied to suit the cooling requirements of the conductors 84. For example, in the embodiment illustrated in FIGS. 10A–10C, the circulating system 1000 forces or directs the fluid 1002 between the first side wall 112 and the intermediate wall 120 and the second side wall 114 and the intermediate wall 120 to cool the conductors 84. In this embodiment, the circulating system 1000 includes (i) a reservoir 1004 for receiving the fluid 1002, (ii) a heat exchanger 1006, i.e. a chiller unit, for cooling the fluid 1002, (iv) an outlet pipe 1008 which connects the stage frame 16 to the heat exchanger, (v) a fluid pump 1010, and (vi) an inlet pipe 1012 for transferring the fluid 1002 from the fluid pump 1010 to the stage frame 16.

The temperature, flow rate, and type of the fluid 1002 is selected and controlled to precisely control the temperature of the conductors 84. For the embodiment illustrated, the fluid temperature is preferably maintained between approximately 20 and 25° C., and the flow rate is between approximately one and five liters per minute. A suitable fluid 1002 is Flourinert type FC-77, made by 3M Company in Minneapolis, Minn. Preferably, the rate of flow of the fluid 1002 and the temperature of fluid 1002 is controlled to maintain an outer surface of the stage frame 16 at a predetermined temperature. By controlling the outer surface temperature of the stage frame 16, heat transferred from the conductors 84 to the surrounding environment can be minimized and/or eliminated.

Figure 11A:
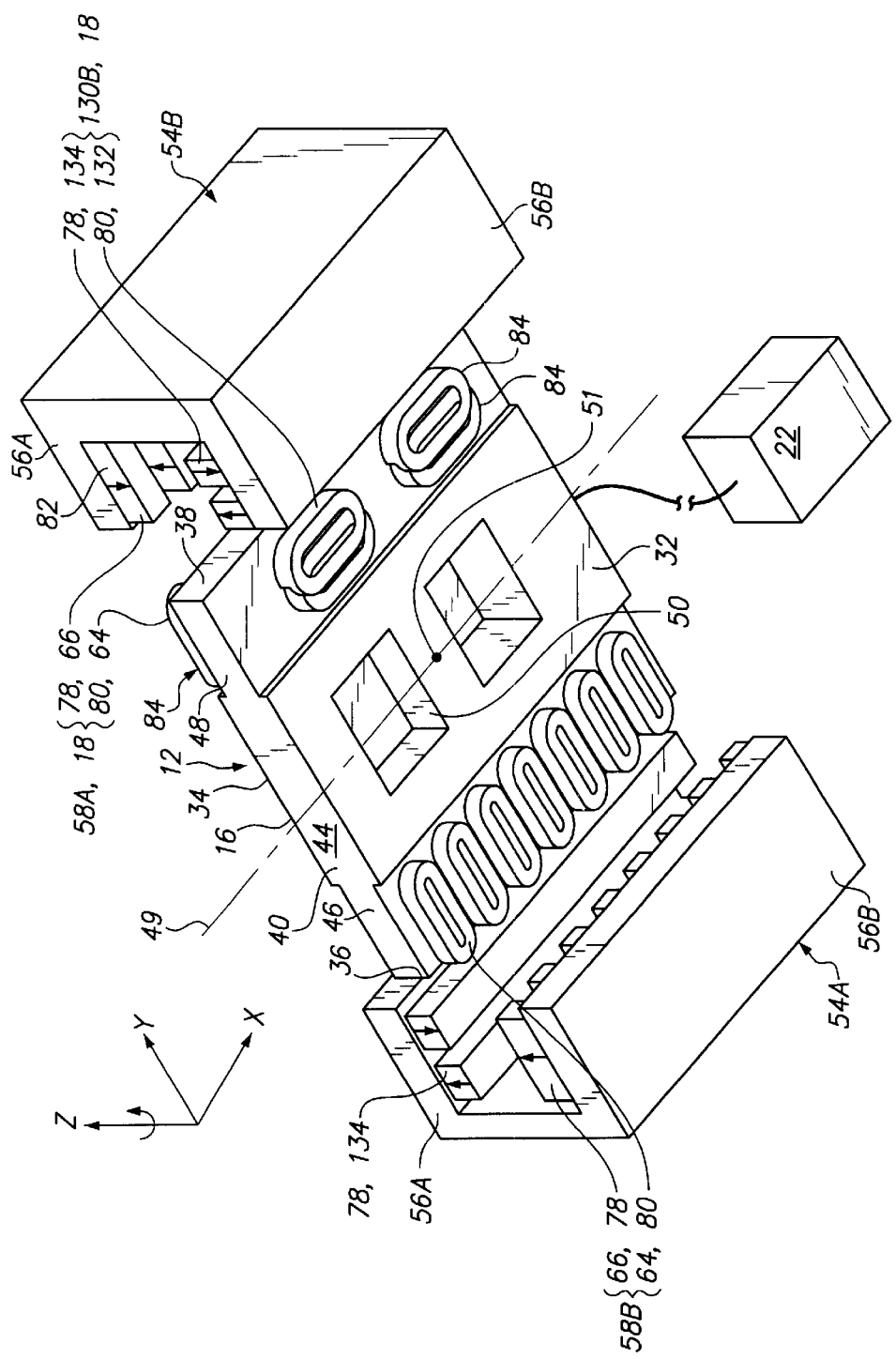
FIG. 11A is a partly exploded, bottom perspective view of another embodiment of a stage assembly having features of the present invention.
Figure 11B:
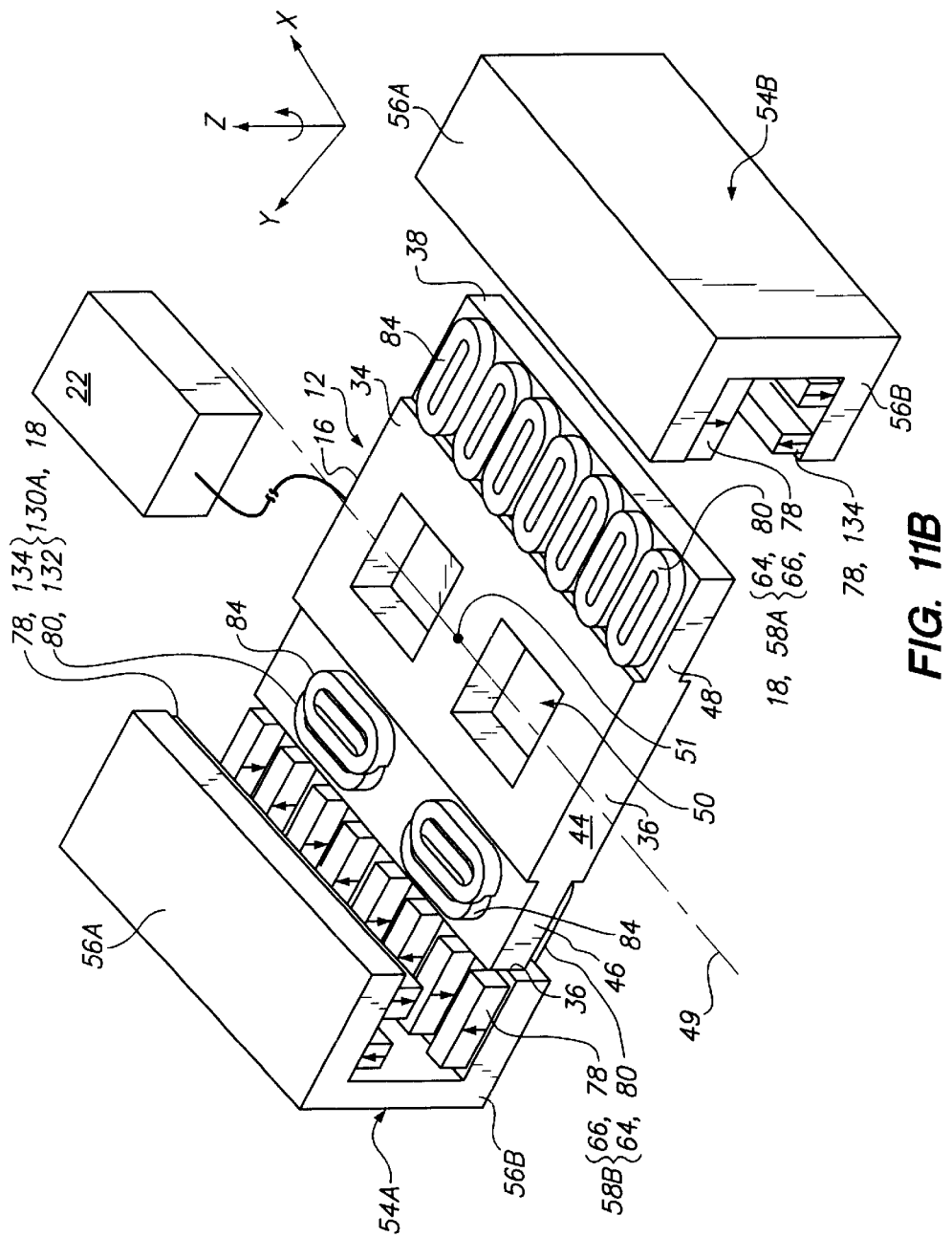
FIG. 11B is a partly exploded, top perspective view of the stage assembly of FIG. 11A.

FIGS. 11A and 11B illustrate yet another embodiment of a stage assembly 10. In this embodiment, the stage frame 16, the X movers 58A, 58B and the mounting frame 14 are similar to that illustrated in FIGS. 1–3. However, this embodiment includes a pair of upper YZ movers 130A and a pair of lower YZ movers 130B instead of the Y movers and the Z movers illustrated in FIGS. 1–3. The YZ movers 130A, 130B cooperate to selectively move the stage frame 16 along the Y axis, along the Z axis, about the X axis, about the Y axis and about the Z axis.

In the embodiment illustrated in the FIGS. 11A and 11B, each YZ mover 130A, 130B is a commutated, two phase actuator that generates a substantially linear force along the Y axis and a substantially linear force along the Z axis. Each YZ mover 130A, 130B includes a YZ stage component 132. The upper YZ movers 130A include a YZ base component 134 and the lower YZ movers 130B include a YZ base component 134. The YZ stage component 132 interacts with the YZ base component 134 to move the stage frame 16 along the Y axis and about the Z axis.

The YZ stage component 132 for each YZ mover 130A, 130B is secured to the stage frame 16 and the YZ base components 134 are secured to one of the legs 56A, 56B of one of the frame bodies 54A, 54B. More specifically, (i) the YZ stage components 132 for the upper YZ movers 130A are spaced apart and secured to the first side section 46 and the frame top 34 of the stage frame 16 near the frame first side 36 and (ii) the YZ base component 134 for the upper YZ movers 130A is secured to the upper leg 56A of the first frame body 54A. For the lower YZ movers (i) each YZ stage component 132 is secured to the second side section 48 and the frame bottom 32 of the stage frame 16 near the frame second side 38 and (ii) the YZ base component 134 extends along and is secured to the lower leg 56B of the second frame body 54B.

In the embodiment illustrated in FIGS. 11A and 11B, the YZ stage component 132 each the YZ mover 130A, 130B includes a conductor array 80 having a pair of overlapped conductors 84. Each YZ base component 134 is a magnet array 78 including a pair of spaced apart magnets 82. Alternately, the stage assembly 10 can be designed with the YZ base component including a coil array and the YZ stage component including a magnet array.

Importantly, in the design illustrated in FIGS. 11A–11B, the conductors 84 of the YZ movers 130A, 130B are overlapped. As a result thereof, the adjacent conductors 84 interact with the flux generated by the magnet array 78 of the YZ movers 130A, 130B at a different angles. By controlling the current to the overlapped conductors 84, the YZ movers 130A, 130B generate a force along the Y axis and along the Z axis.

With the design illustrated in FIGS. 11A and 11B, the control system 22 controls the X movers 58A, 58B, the YZ movers 130A, 130B to precisely move the stage 12 relative to the mounting frame 14. More specifically, the control system 22 directs and controls the current to X stage component 64 for each of the X mover 58A, 58B to control movement of the stage 12 along the X axis. Similarly, the control system 22 directs and controls the current to YZ stage component 132 for each of the YZ mover 130A, 130B to control movement of the stage 12 along the Y axis, along the Z axis, about the X axis, about the Y axis and about the Z axis.

FIG. 12 illustrates that a secondary stage 136 can be incorporated into the stage assembly 10 to move an object 24. The stage assembly 10 is somewhat similar to that illustrated in FIGS. 1–3. In particular, the stage assembly 10 includes the mounting frame 14 and the mover assembly 18 similar to that discussed above in reference to FIGS. 1–3. With this design, the mover assembly 18 moves the stage 12 with a relatively large displacement along the X axis, a limited displacement along the Y axis, and a limited displacement about the Z axis (theta Z) relative to the mounting frame 14.

The stage frame 16 is somewhat similar to that illustrated in FIGS. 1–3 and described above. However, in the embodiment illustrated in FIG. 12, the stage frame 16 does not include any holders and the secondary stage 136 moves relative to the stage frame 16 with a relatively large displacement along the Y axis.

A secondary mover 138 is used to move the secondary stage 136 relative to the stage frame 16 with a relatively large displacement along the Y axis. The secondary mover 138 includes a secondary first component 140 that is secured to the stage frame 16 and a secondary second component 142 that is secured to the secondary stage 136. Specifically, the secondary first component 140 and the secondary second component 142 interact to selectively move the secondary stage 136 relative to the stage frame 16 along the Y axis. In the embodiment illustrated in the FIG. 12, the secondary mover 138 is a linear motor. In this embodiment, (i) the secondary first component 140 includes a magnet array 78 including a plurality of magnets 82 that extend along the stage frame 16 and (ii) the secondary second component 142 includes a conductor array 80 having a plurality of spaced apart conductors 84 that is secured to the secondary stage 136. Alternately, the stage assembly 10 could be designed with the secondary first component including a coil array and the secondary second component including a magnet array.

The secondary stage 136 includes a stage block 144, a device holder 146, a X mirror 148, and a Y mirror 150. The stage block 144 is cube shaped and includes a rectangular shaped block channel 152 that extends transversely through the stage block 144. The block channel 152 is sized and shaped to receive the stage frame 16. The stage block 144 can be supported spaced apart from the stage frame 16 by alternate ways. For example, a fluid bearing could be utilized. With this design, the stage block 144 includes a plurality of spaced apart fluid outlets (not shown) directed into the block channel 152 towards the stage frame 16. Pressurized fluid (not shown) is released from the fluid outlets towards stage frame 16 to create a fluid bearing between the stage block 144 and the stage frame 16. The fluid bearing maintains the stage block 144 spaced apart from the stage frame 16 and allows for motion of the secondary stage 136 along the Y axis relative to the stage frame 16.

The device holder 146 retains the device or wafer 30 during processing. The design of the device holder 146 can be varied. In the embodiment illustrated in FIG. 12, the device holder 146 can be a vacuum chuck, an electrostatic chuck or some other type of clamp. The device holder 146 is secured to a top of the stage block 144.

The X mirror 148 and the Y mirror 150 are used as part of a measurement system (not shown) to monitor the position of the secondary stage 136. With this information, the position of the secondary stage 136 can be adjusted. The design of the measurement system can be varied. For example, the measurement system can include a X interferometer block (not shown) and a Y interferometer block (not shown). The X interferometer block interacts with the X mirror 148 to monitor the location of the secondary stage 136 along the X axis. More specifically, the X interferometer block generates a measurement signal (not shown) that is reflected off of the X mirror 148. With this information, the location of the secondary stage 136 along the X axis can be monitored.

Similarly, the Y mirror 150 interacts with the Y interferometer block to monitor the position of the secondary stage 136 along the Y axis and about the Z axis (theta Z). More specifically, the Y interferometer block generates a pair of spaced apart, measurement signals (not shown) that are reflected off of the Y mirror 150. With this information, the location of the secondary stage 136 along the Y axis and about the Z axis can be monitored.

Figure 13:
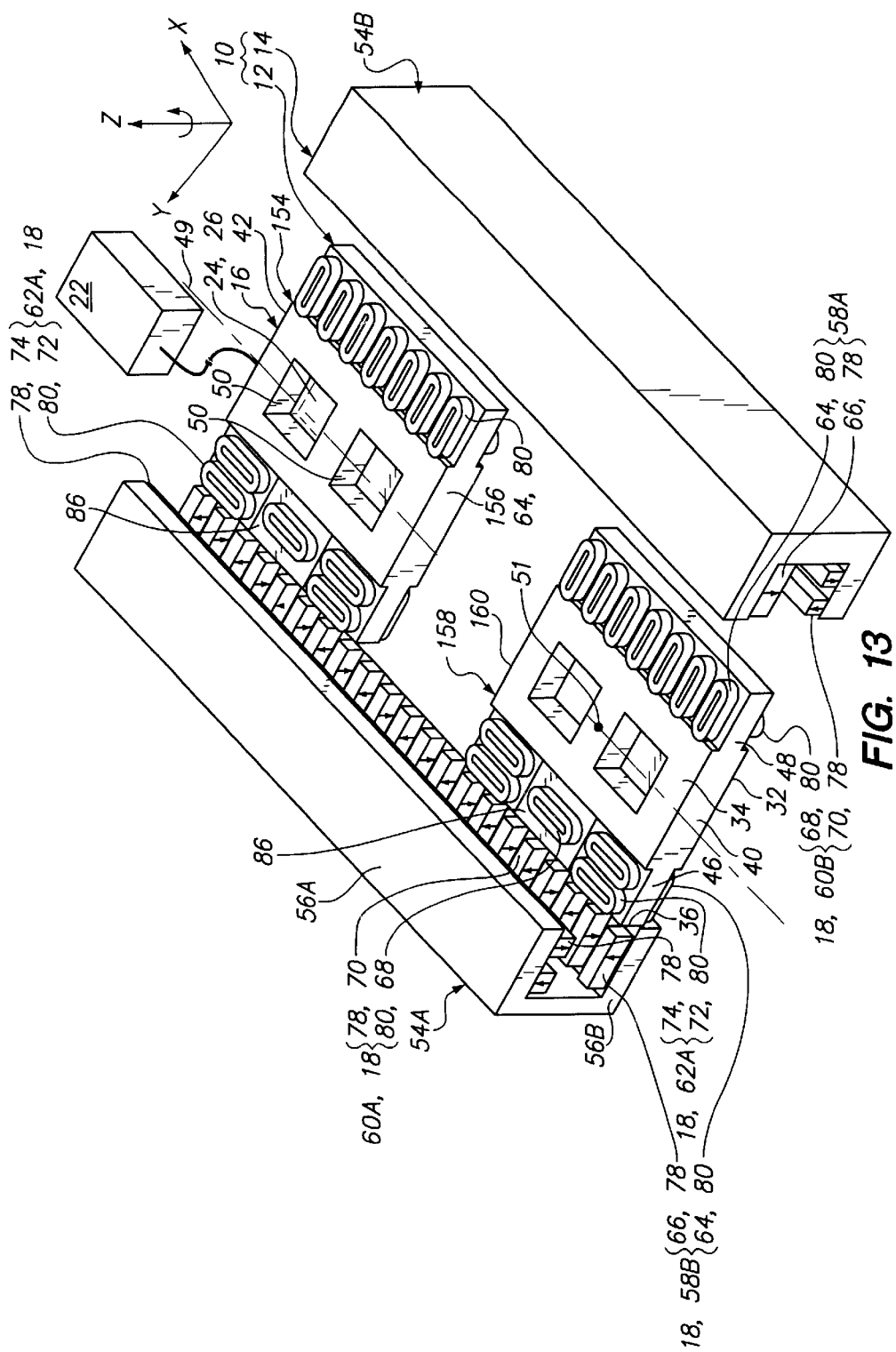
FIG. 13 is a partly exploded perspective view of another embodiment of a stage assembly.

FIG. 13 illustrates yet another embodiment of a stage assembly 10 having features of the present invention. In the embodiment illustrated in FIG. 13, the stage assembly 10 includes a first stage 154 having a first stage frame 156 and a second stage 158 having a second stage frame 160. Each of the stages 154, 158 can be independently moved relative to the mounting frame 14. Each of these stages 154, 158 can be similar in design to the stage 12 illustrated in FIGS. 1–3 and discussed above. Each of the stages 154, 158 illustrated in FIG. 13 includes a pair of holders 50. The mounting frame 14 and the mover assembly 18 are also somewhat similar to the mounting frame 14 and the mover assembly 18 illustrated in FIGS. 1–3 and discussed above.

Importantly, it should be noted that each of the stages 154, 158 include stage components 64, 68, 72 similar to the stage 12 illustrated in FIGS. 1–3. However, the stages 154, 158 of FIG. 13 interact with and share the base components 66, 70, 74. Further, it should be noted that control system 22 individually and independently controls the movement each of the stages 154, 158 relative to the mounting frame 14 with at least three degrees of freedom.

FIG. 14 is a schematic view illustrating an exposure apparatus 28 useful with the present invention. The exposure apparatus 28 includes an apparatus frame 200, a light source 202, an illumination system 204 (irradiation apparatus), a reticle stage 206, a lens assembly 208, and a wafer stage 210. The stage assemblies 10 provided herein can be used as the reticle stage 206 and/or the wafer stage 210.

The exposure apparatus 28 is particularly useful as a lithographic device that transfers a pattern (not shown) of an integrated circuit from a reticle onto the semiconductor wafer. The exposure apparatus 28 mounts to the mounting base 20, e.g., the ground, a base, or floor or some other supporting structure.

The apparatus frame 200 is rigid and supports the components of the exposure apparatus 28. The design of the apparatus frame 200 can be varied to suit the design requirements for the rest of the exposure apparatus 28. The apparatus frame 200 illustrated in FIG. 14 supports the lens assembly 208, the light source 202 and the illumination system 204 above the mounting base 20. The reaction frame 52 supports the stages 206, 210 above the mounting base 20.

The light source 202 emits the beam (irradiation) of light energy. The illumination system 204 guides the beam of light energy from the light source 202 to the lens assembly 208. The beam illuminates selectively different portions of the reticle and exposes the wafer. In FIG. 14, the light source 202 is illustrated as being supported above the reticle stage 206. Typically, however, the light source 202 is secured to one of the sides of the apparatus frame 200 and the energy beam from the light source 202 is directed to above the reticle stage 206 with the illumination system 204.

The lens assembly 208 projects and/or focuses the light passing through the reticle to the wafer. Depending upon the design of the exposure apparatus 28, the lens assembly 208 can magnify or reduce the image illuminated on the reticle.

The reticle stage 206 holds and positions the reticle relative to the lens assembly 208 and the wafer. Similarly, the wafer stage 210 holds and positions the wafer with respect to the projected image of the illuminated portions of the reticle. In FIG. 14, the wafer stage 210 and the reticle stage 206 each utilize a stage assembly 10 having features of the present invention. Depending upon the design, the exposure apparatus 28 can also include additional motors to move the stages 210, 206. FIG. 14 illustrates that the mounting frame 14 of each stage assembly 10 is secured with the reaction frame 52 to the mounting base 20.

There are a number of different types of lithographic devices. For example, the exposure apparatus 28 can be used as scanning type photolithography system that exposes the pattern from the reticle onto the wafer with the reticle and wafer moving synchronously. In a scanning type lithographic device, the reticle is moved perpendicular to an optical axis of the lens assembly 208 by the reticle stage 206 and the wafer is moved perpendicular to an optical axis of the lens assembly 208 by the wafer stage 210. Scanning of the reticle and the wafer occurs while the reticle and the wafer are moving synchronously.

Alternately, the exposure apparatus 28 can be a step-and-repeat type photolithography system that exposes the reticle while the reticle and the wafer are stationary. In the step and repeat process, the wafer is in a constant position relative to the reticle and the lens assembly 208 during the exposure of an individual field. Subsequently, between consecutive exposure steps, the wafer is consecutively moved by the wafer stage perpendicular to the optical axis of the lens assembly 208 so that the next field of the wafer is brought into position relative to the lens assembly 208 and the reticle for exposure. Following this process, the images on the reticle are sequentially exposed onto the fields of the wafer so that the next field of the wafer is brought into position relative to the lens assembly 208 and the reticle.

However, the use of the exposure apparatus 28 provided herein is not limited to a photolithography system for semiconductor manufacturing. The exposure apparatus 28, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, electric razors, machine tools, metal cutting machines, inspection machines and disk drives.

The light source 202 can be g-line (436 nm), i-line (365 nm), KrF excimer laser (248 nm), ArF excimer laser (193 nm) and $F_2$ laser (157 nm). Alternately, the light source 202 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the lens assembly 208 included in the photolithography system, the lens assembly 208 need not be limited to a reduction system. It could also be a 1× or magnification system.

With respect to a lens assembly 208, when far ultra-violet rays such as the excimer laser is used, glass materials such as quartz and fluorite that transmit far ultra-violet rays is preferable to be used. When the $F_2$ type laser or x-ray is used, the lens assembly 208 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the abovementioned U.S. patents, as well as the Japan patent applications published in the Official Gazette for Laid-Open Patent Applications are incorporated herein by reference.

Further, in photolithography systems, when linear motors (see U.S. Pat. No. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and cleanliness are controlled.

Figure 15:
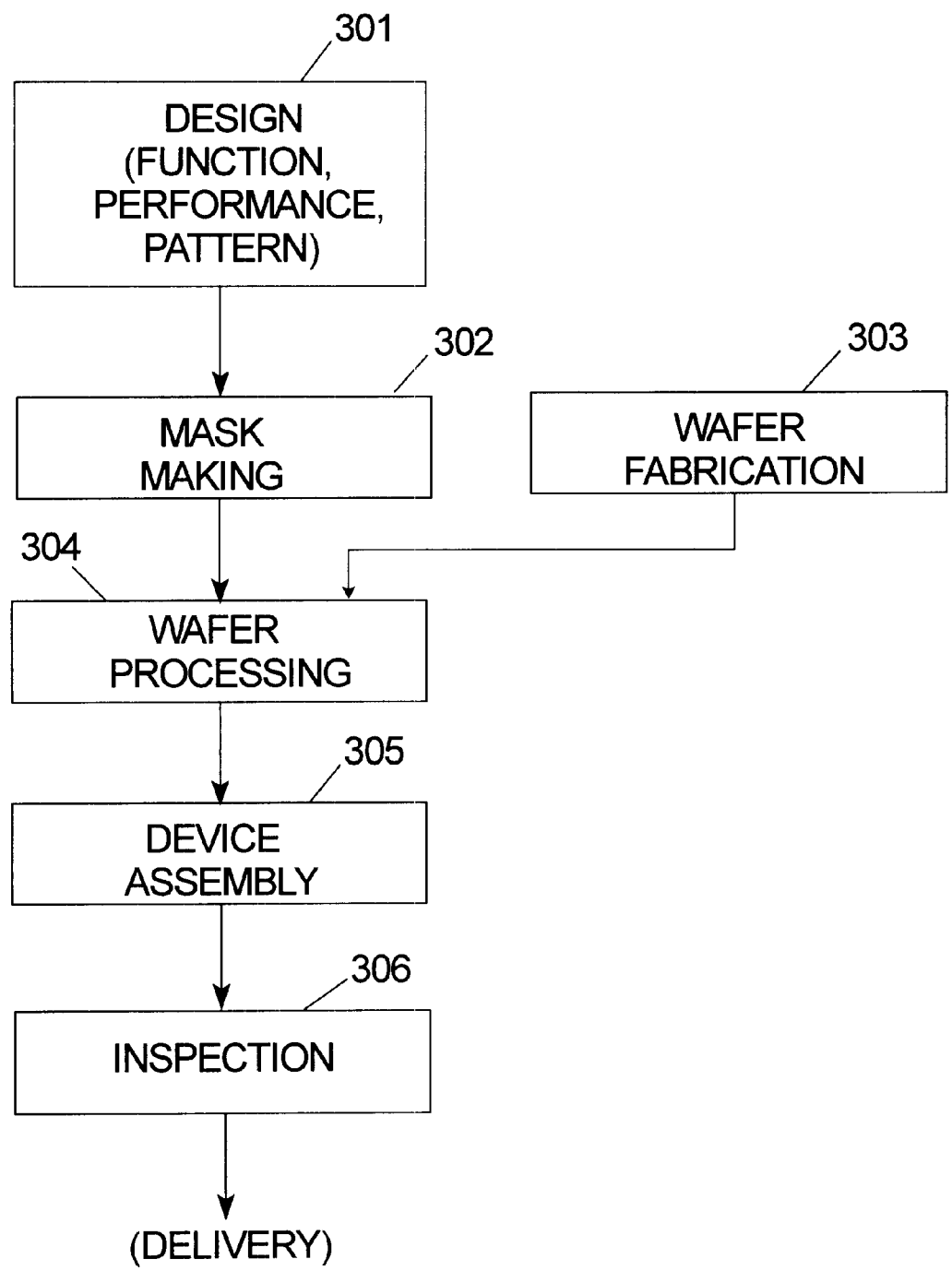
FIG. 15 is a flow chart that outlines a process for manufacturing a device in accordance with the present invention.

Further, semiconductor devices can be fabricated using the above described systems, by the process shown generally in FIG. 15. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 16:
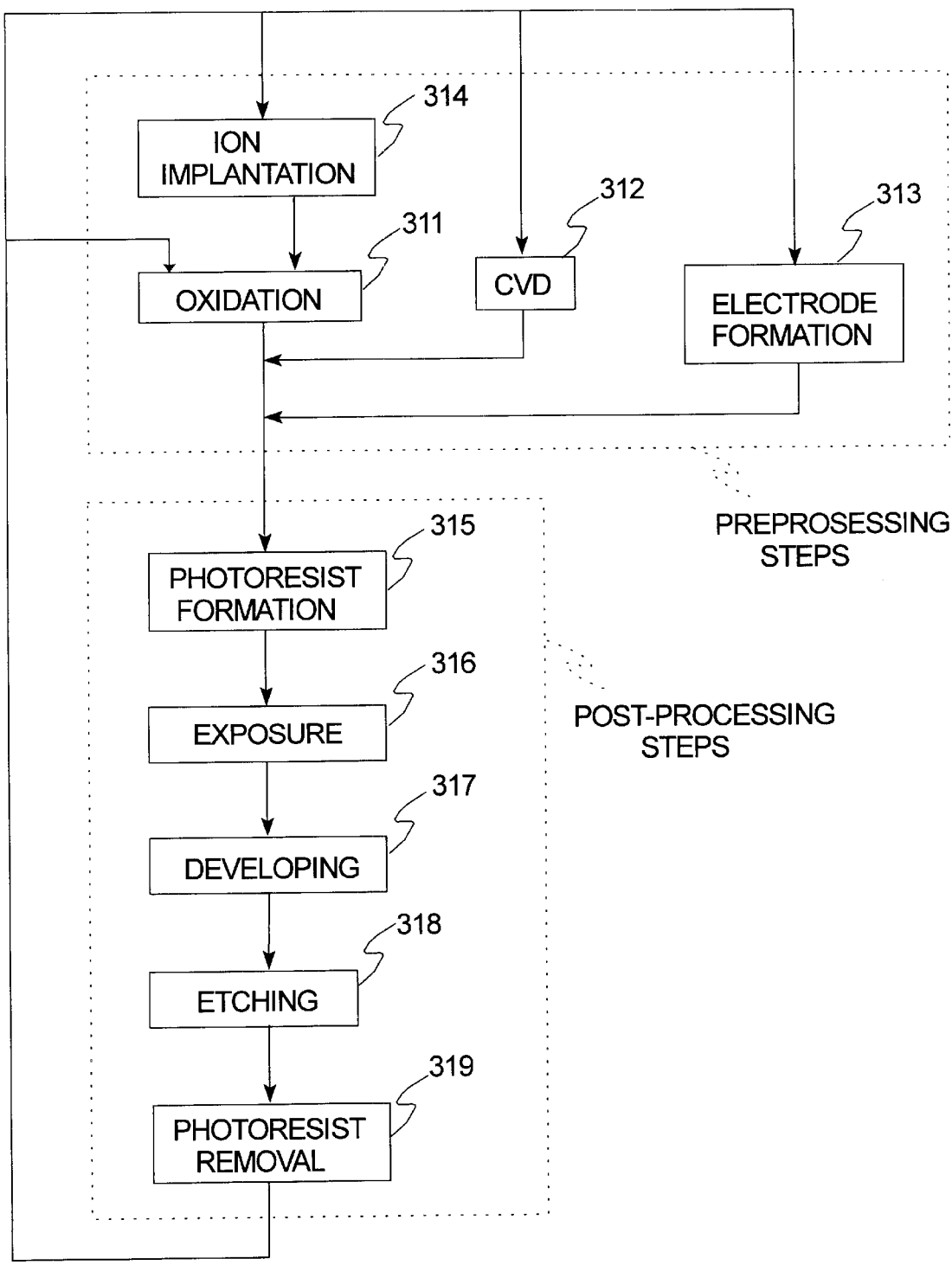
FIG. 16 is a flow chart that outlines device processing in more detail.

FIG. 16 illustrates a detailed flowchart example of the above-mentioned step 304 in the case of fabricating semiconductor devices. In FIG. 16, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, firstly, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step) the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that is adapted to move an object, the stage assembly comprising:
   a mounting frame;
   a stage frame that is movable relative to the mounting frame along a first axis and a second axis that is substantially orthogonal to the first axis, wherein the stage frame includes a first side section and a second side section that is spaced apart and substantially parallel to the first side section;
   a first mover adapted to move the stage frame along the first axis, the first mover including a first stage component that is secured to the stage frame; and
   a second mover adapted to move the stage frame along the second axis, the second mover including a second stage component that is secured to the stage frame, wherein the first stage component and the second stage component are secured to the first side section and the second side section, and wherein the positional relationship between the first stage component and the second stage component relative to a third axis that is substantially orthogonal to the first axis and the second axis at the first side section is different from the positional relationship between the first stage component and the second stage component relative to the third axis at the second side section.

2. The stage assembly of claim 1 wherein the first axis, the second axis and the third axis are an X axis, a Y axis and a Z axis respectively, and the first mover is an X mover including an X stage component that is secured to the stage frame, and the second mover is a Y mover including a Y stage component that is secured to the stage frame.

3. The stage assembly of claim 2 wherein one of the movers is also adapted to rotate the stage frame around the Z axis.

4. The stage assembly of claim 2 wherein the X mover is adapted to move the stage frame at least approximately 250 millimeters along the X axis.

5. The stage assembly of claim 2 including a Z mover adapted to move the stage frame along the Z axis.

6. The stage assembly of claim 5 wherein the Z mover is adapted to move the stage frame about the X axis and about the Y axis.

7. The stage assembly of claim 5 wherein the Z mover includes an upper Z mover and a lower Z mover that are adapted to move the stage frame along the Z axis, wherein the upper Z mover and the lower Z mover are substantially diametrically opposed relative to a stage central axis.

8. The stage assembly of claim 5 wherein (i) the X mover includes an upper X mover and a lower X mover adapted to move the stage frame along the X axis, each X mover including an X stage component secured to the stage frame, (ii) the Y mover includes an upper Y mover and a lower Y mover adapted to move the stage frame along the Y axis, each Y mover including a Y stage component secured to the stage frame, and (iii) the Z mover includes an upper Z mover and a lower Z mover adapted to move the stage frame along the Z axis, each Z mover including a Z stage component secured to the stage frame.

9. The stage assembly of claim 8 wherein (i) the stage component of the upper X mover is position substantially directly above the stage components for the lower Y mover and the lower Z mover and (ii) the stage component of the lower X mover is positioned substantially directly below the stage components for the upper Y mover and the upper Z mover.

10. The stage assembly of claim 9 wherein (i) the stage components of the lower X mover, the upper Y mover and upper Z mover are secured to the first side section of the stage frame and (ii) the stage components of the upper X mover, the lower Y mover and lower Z mover are secured to the second side section of the stage frame.

11. The stage assembly of claim 8 wherein at least one of the stage components includes at least one conductor array.

12. The stage assembly of claim 8 wherein the movers act through the center of gravity of the stage frame.

13. The stage assembly of claim 2 wherein the X mover includes an upper X mover and a lower X mover that are adapted to move the stage frame along the X axis, wherein the upper X mover and the lower X mover are substantially diametrically opposed relative to a stage central axis of the stage frame.

14. The stage assembly of claim 2 wherein the Y mover includes an upper Y mover and a lower Y mover that are adapted to move the stage frame along the Y axis, wherein the upper Y mover and the lower Y mover are substantially diametrically opposed relative to a stage central axis.

15. The stage assembly of claim 1 wherein the stage frame includes a main section that retains the object, the main section being between the first side section and the second side section in the direction parallel to the second axis.

16. The stage assembly of 15 wherein the main section of the stage frame includes a holder that is adapted to retain the object.

17. The stage assembly of 15 wherein the main section of the stage frame includes at least two holders, each holder being adapted to retain one object.

18. The stage assembly of claim 1 wherein the stage frame is at least partly hollow.

19. The stage assembly of claim 18 including a circulating system that circulates a fluid through the stage frame.

20. The stage assembly of claim 1 wherein the stage frame is free to move with at least three degrees of freedom relative to the mounting frame.

21. The stage assembly of claim 1 wherein the stage frame is free to move with at least six degrees of freedom relative to the mounting frame.

22. An exposure apparatus including the stage assembly of claim 1.

23. A device manufactured with the exposure apparatus according to claim 22.

24. A wafer on which an image has been formed by the exposure apparatus of claim 22.

25. The stage assembly of claim 1 wherein the second stage component is secured to the stage frame substantially directly above the first stage component.

26. The stage assembly of claim 1 wherein the second stage component is secured to the stage frame substantially directly below the first stage component.

27. A stage assembly that is adapted to move an object, the stage assembly comprising:
a mounting frame;
a stage frame that is movable relative to the mounting frame along a first axis, along a second axis that is substantially orthogonal to the first axis, and along a third axis that is substantially orthogonal to the first axis and the second axis, the stage frame including a first side section and a second side section that is spaced apart and substantially parallel to the first side section;
a first mover adapted to move the stage frame along the first axis, the first mover including a first stage component that is secured to the stage frame;
a second mover adapted to move the stage frame along the second axis, the second mover including a second stage component that is secured to the stage frame; and
a third mover adapted to move the stage frame along the third axis, the third mover including a third stage component that is secured to the stage frame, wherein the stage components of the first mover, the second mover and the third mover are secured to the first side section and the second side section, and wherein the positional relationship between the stage components of the first mover, the second mover and the third mover relative to the third axis at the first side section is different from the positional relationship between the stage components of the first mover, the second mover and the third mover relative to the third axis at the second side section.

28. The stage assembly of claim 27 wherein the first axis, the second axis and the third axis are an X axis, a Y axis and a Z axis respectively, and the first mover is an X mover including an X stage component that is secured to the stage frame, the second mover is a Y mover including a V stage component that is secured to the stage frame, and the third mover is a Z mover including a Z stage component that is secured to the stage frame.

29. The stage assembly of claim 28 wherein the X stage component is positioned substantially directly below the Y stage component and the Z stage component.

30. The stage assembly of claim 28 wherein X stage component is positioned substantially directly above the Y stage component and the Z stage component.

31. The stage assembly of claim 28 wherein the X mover includes an upper X mover and a lower X mover that are adapted to move the stage frame along the X axis, wherein the upper X mover and the lower X mover are substantially diametrically opposed relative to a stage central axis of the stage frame.

32. The stage assembly of claim 28 wherein the Y mover includes an upper Y mover and a lower Y mover that are adapted to move the stage frame along the Y axis, wherein the upper Y mover and the lower Y mover are substantially diametrically opposed relative to a stage central axis.

33. The stage assembly of claim 28 wherein the Z mover includes an upper Z mover and a lower Z mover that are adapted to move the stage frame along the Z axis, wherein the upper Z mover and the lower Z mover are substantially diametrically opposed relative to a stage central axis.

34. The stage assembly of claim 28 wherein (i) the X mover includes an upper X mover and a lower X mover adapted to move the stage frame along the X axis, each X mover including a X stage component secured to the stage frame, (ii) the Y mover includes an upper Y mover and a lower Y mover adapted to move the stage frame along the Y axis, each Y mover including a Y stage component secured to the stage frame, and (iii) the Z mover includes an upper Z mover and a lower Z mover adapted to move the stage frame along the Z axis, each Z mover including a Z stage component secured to the stage frame.

35. The stage assembly of claim 34 wherein (i) the stage component of the upper X mover is position substantially directly above the stage components for the lower Y mover and the lower Z mover and (ii) the stage component of the lower X mover is positioned substantially directly below the stage components for the upper Y mover and the upper Z mover.

36. The stage assembly of claim 34 wherein (i) the stage components of the lower X mover, the upper Y mover and upper Z mover are secured to the first side section of the stage frame and (ii) the stage components of the upper X mover, the lower Y mover and lower Z mover are secured to the second side section of the stage frame.

37. The stage assembly of claim 34 wherein the movers act through the center of gravity of the stage frame.

38. The stage assembly of claim 27 wherein the stage frame is at least partly hollow.

39. An exposure apparatus including the stage assembly of claim 27.

40. A device manufactured with the exposure apparatus according to claim 39.

41. A wafer on which an image has been formed by the exposure apparatus of claim 39.

42. A method for making a stage assembly that is adapted to move an object, the method comprising the steps of:
providing a mounting frame;
providing a stage frame, the stage frame being movable relative to the mounting frame along a first axis, along a second axis that is substantially orthogonal to the first axis, and along a third axis that is substantially orthogonal to the first axis and the second axis, the stage frame including a first side section and a second side section that is spaced apart and substantially parallel to the first side section;
coupling a first mover to the mounting frame and the stage frame, the first mover moving the stage frame along the first axis, and including a first stage component that is secured to the stage frame;
coupling a second mover to the mounting frame and the stage frame, the second mover moving the stage frame along the second axis, and including a second stage component that is secured to the stage frame; and coupling a third mover to the mounting frame and the stage frame, the third mover moving the stage frame along the third axis, and including a third stage component that is secured to the stage frame, wherein the stage components of the first mover, the second mover and the third mover are secured to the first side section and the second side section, and wherein the positional relationship between the stage components of the first mover, the second mover and the third mover relative to the third axis at the first side section is different from the positional relationship between the stage components of the first mover, the second mover and the third mover relative to the third axis at the second side section.

43. The method of claim 42 wherein the first axis, the second axis and the third axis are an X axis, a Y axis and a Z axis respectively, and the first mover is an X mover including an X stage component that is secured to the stage frame, the second mover is a Y mover including a Y stage component that is secured to the stage frame, and the third mover is a Z mover including a Z stage component that is secured to the stage frame.

44. The method of claim 43 wherein the X mover includes an upper X mover and a lower X mover that are adapted to move the stage frame along the X axis, wherein the upper X mover and the lower X mover being substantially diametrically opposed relative to a stage central axis of the stage frame.

45. A method for making an exposure apparatus that forms an image on a wafer, the method comprising the steps of:

providing an irradiation apparatus that irradiates the wafer with radiation to form the image on the wafer; and providing the stage assembly made by the method of claim 42.

46. A method of making a wafer utilizing the exposure apparatus made by the method of claim 45.

47. A method of making a device including at least the exposure process: wherein the exposure process utilizes the exposure apparatus made by the method of claim 45.

48. A stage assembly that is adapted to move an object, the stage assembly comprising:

a mounting frame;

a monolithic stage frame that retains the object, the monolithic stage frame being movable along an X axis, along a Y axis that is substantially orthogonal to the X axis, and around a Z axis that is substantially orthogonal to the X axis and the Y axis relative to the mounting frame;

an X mover adapted to move the stage frame along the X axis, the X mover including an X stage component secured to the stage frame; and a Y mover adapted to move the stage frame along the Y axis, the Y mover including a Y stage component secured to the stage frame substantially directly above the X stage component.

49. A stage assembly that is adapted to move an object, the stage assembly comprising:

a mounting frame;

a monolithic stage frame that retains the object, the monolithic stage frame being movable along an X axis, along a Y axis that is substantially orthogonal to the X axis, and around a Z axis that is substantially orthogonal to the X axis and the Y axis relative to the mounting frame;

an X mover adapted to move the stage frame along the X axis, the X mover including an X stage component secured to the stage frame; and a Y mover adapted to move the stage frame along the Y axis, the Y mover including a Y stage component secured to the stage frame substantially directly below the X stage component.

50. A stage assembly that is adapted to move an object, the stage assembly comprising:

a mounting frame;

a monolithic stage frame that retains the object the stage frame including a first side section and a second side section that is spaced apart from and substantially parallel to the first side section;

an X mover adapted to move the stage frame along an X axis, the X mover including an X stage component that is secured to the stage frame;

a Y mover adapted to move the stage frame along a Y axis that is substantially orthogonal to the X axis, the Y mover including a Y stage component that is secured to the stage frame; and a Z mover adapted to move the stage frame along a Z axis that is substantially orthogonal to the X axis and the Y axis, the Z mover including a Z stage component that is secured to the stage frame;

wherein the stage components of the X mover, the Y mover and the Z mover are secured to the side sections.

51. A stage assembly that is adapted to move an object, the stage assembly comprising:

a mounting frame;

a stage frame that retains the object;

an X mover adapted to move the stage frame along an X axis, the X mover including an X stage component that is secured to the stage frame;

a Y mover adapted to move the stage frame along a Y axis that is substantially orthogonal to the X axis, the Y mover including a Y stage component that is secured to the stage frame; and a Z mover adapted to move the stage frame along a Z axis that is substantially orthogonal to the X axis and the Y axis, the Z mover including a Z stage component that is secured to the stage frame;

wherein the X stage component is positioned substantially directly below the Y stage component and the Z stage component.

* * * * *

UNITED STATES PATENT AND TRADEMARK OFFICE
CERTIFICATE OF CORRECTION

PATENT NO. : 6,405,659 B1
DATED : June 18, 2002
INVENTOR(S) : Hazelton

It is certified that error appears in the above-identified patent and that said Letters Patent is hereby corrected as shown below:

<u>Column 6,</u>
Line 57, please delete "58A. 58B" and replace it with -- 58A, 58B --.

<u>Column 9,</u>
Line 20, please delete "upper 74 movers" and replace it with -- upper Z movers --.

<u>Column 10,</u>
Line 49, please delete "With this design. the Z movers" and replace it with -- With this design, the Z movers --.

<u>Column 17,</u>
Line 57, please delete "radiation VUV)" and replace it with -- radiation (VUV) --.

<u>Column 21,</u>
Line 56, please delete "a V stage" and replace it with -- a Y stage --.

Signed and Sealed this

Nineteenth Day of November, 2002

Attest:

Attesting Officer

JAMES E. ROGAN
*Director of the United States Patent and Trademark Office*